United States Patent
Shih et al.

(10) Patent No.: US 10,784,840 B2
(45) Date of Patent: Sep. 22, 2020

(54) TUNABLE FILM BULK ACOUSTIC RESONATORS AND FBAR FILTERS WITH DIGITAL TO ANALOG CONVERTERS

(71) Applicants: Ishiang Shih, Brossard (CA); Cindy X. Qiu, Brossard (CA); Chunong Qiu, Brossard (CA); Andy Shih, Brossard (CA); Julia Qiu, Brossaed (CA); Yi-Chi Shih, Los Angeles, CA (US)

(72) Inventors: Ishiang Shih, Brossard (CA); Cindy X. Qiu, Brossard (CA); Chunong Qiu, Brossard (CA); Andy Shih, Brossard (CA); Julia Qiu, Brossaed (CA); Yi-Chi Shih, Los Angeles, CA (US)

(*) Notice: Subject to any disclaimer, the term of this patent is extended or adjusted under 35 U.S.C. 154(b) by 45 days.

(21) Appl. No.: 15/998,066

(22) Filed: Jun. 25, 2018

(65) Prior Publication Data
US 2019/0393860 A1    Dec. 26, 2019

(51) Int. Cl.
*H03H 9/56*    (2006.01)
*H03H 9/17*    (2006.01)
*H03H 9/13*    (2006.01)
*H03H 9/02*    (2006.01)

(52) U.S. Cl.
CPC ........ *H03H 9/564* (2013.01); *H03H 9/02023* (2013.01); *H03H 9/02031* (2013.01); *H03H 9/02102* (2013.01); *H03H 9/13* (2013.01); *H03H 9/171* (2013.01); *H03H 9/568* (2013.01)

(58) Field of Classification Search
CPC ............... H03H 9/564; H03H 9/02023; H03H 9/02031; H03H 9/02102; H03H 9/13; H03H 9/171; H03H 9/568
USPC ........................................................ 333/188
See application file for complete search history.

(56) References Cited

U.S. PATENT DOCUMENTS

2017/0025596 A1*    1/2017    Qiu ....................... H01P 1/201

OTHER PUBLICATIONS

Maxim App Note 1071, DAC-Powered Charge Pump Varies Negative Rail, Jul. 9, 1998 (Year: 1998).*

* cited by examiner

*Primary Examiner* — Benny T Lee
*Assistant Examiner* — Hafizur Rahman

(57) ABSTRACT

The present invention provides tunable film bulk acoustic resonators (FBARs) with the resonant frequency of the acoustic wave to be excited and to be transmitted tuned by digital to analog converters which convert an input digital signal to an output DC voltage and provide DC bias voltages to the FBARs through integrated thin film biasing resistors. The polarity and the value of the output DC voltage are controlled by the input digital signal to achieve selection and tuning of the resonant frequency of the FBARs. A plurality of the tunable FBARs are connected to form microwave filters with tunable bandpass frequencies and oscillators with selectable resonating frequencies by varying the input digital signals applied to the digital to analog converters.

20 Claims, 6 Drawing Sheets

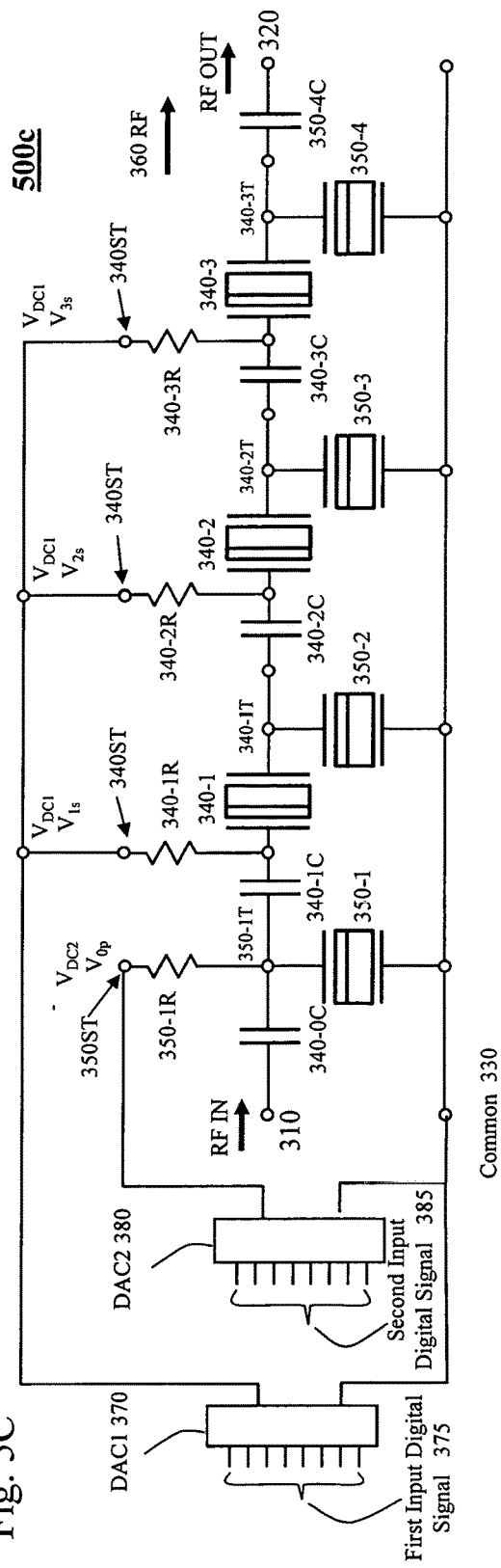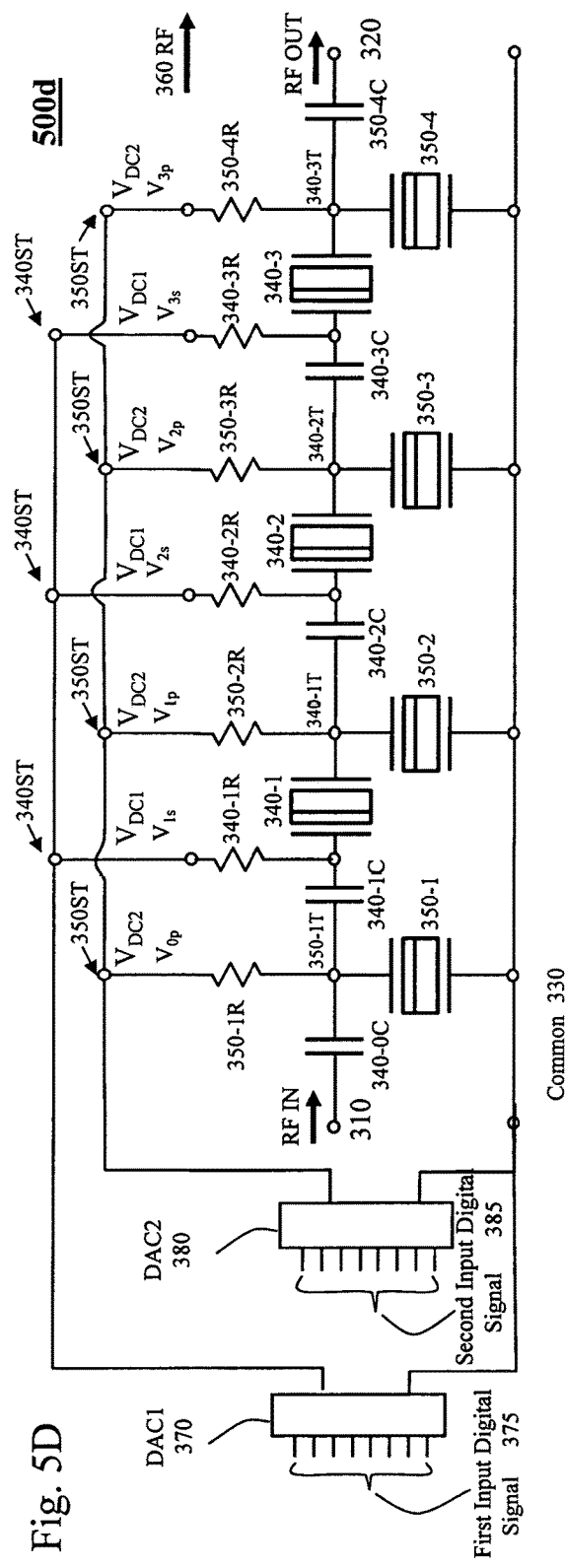

TUNABLE FILM BULK ACOUSTIC RESONATORS AND FBAR FILTERS WITH DIGITAL TO ANALOG CONVERTERS

FIELD OF THE INVENTION

This invention relates to tunable filtering of frequency and generation of frequency of RF signals for communication systems. More specifically, it relates to tunable bulk acoustic wave resonators and FBAR filters with the frequency of operation regulated by a digital to analog converter.

BACKGROUND OF THE INVENTION

Electronic systems especially those for communications applications operated at radio frequencies (RF) require small bandpass filters and oscillators. The oscillators are for generation of RF signals and the bandpass filters are for selection (transmitting or receiving) of signals within certain bandwidth (BW) at a given frequency. Some examples of the systems include global positioning systems (GPS); mobile telecommunication systems consist of: Global Systems for Mobile Communications (GSM), personal communication service (PCS), Universal Mobile Telecommunications System (UMTS), Long Term Evolution Technology (LTE); data transfer units containing: Bluetooth, Wireless Local Area Network (WLAN); satellite broadcasting and future traffic control communications. They also include other high frequency systems for air and space vehicles.

RF bandpass filters are fabricated using different technologies: (a) ceramic filters based on dielectric resonators; (b) filters based on surface acoustic wave resonators (SAW); and (c) filters using thin film bulk acoustic wave resonators (FBAR). Both SAW and FBAR are used when dimensions of the systems are limited. Presently, SAW devices are mainly used in volume applications at frequencies below 2 GHz whereas FBARs are dominant in systems operated at frequencies of 2 to 4 GHz or higher. Due to large volumes, current SAW or FBAR RF filters in handsets are manufactured by microelectronic fabrication processes on wafers using piezoelectric materials such as $LiNbO_3$ (for SAWS) and AlN (for FBARs).

Surface Acoustic Wave (SAW) Filters

The development of SAW devices dated back to 1965, when the first SAW devices were made. Earlier research work in SAW devices was largely to fulfill the needs of radar signal processing. In the 1980s and 1990s, the main development efforts were focused on low loss filters particularly for mobile phones. The basic principles of SAW devices can be understood by considering a basic SAW structure. FIG. 1A shows a schematic diagram of a prior art SAW filter (100) on a piezoelectric substrate (110), with an input inter digital transducer IDT1 (120) with a center-to-center distance between adjacent electrodes controlled to a "pitch" and connected to an electrical signal source (130) to excite acoustic waves (140) with a velocity v and at a frequency $f_o=v/(2\times pitch)$, an output inter digital transducer IDT2 (150) with a center-to-center distance between adjacent electrodes again also controlled to the "pitch" to receive the acoustic waves (140) and to convert them into an output electrical signal (160). Electrical signals in the signal source (130) at frequencies other than $f_o$ cannot excite resonant acoustic waves in the input IDT1 (120) with sufficient level to reach the output IDT2 (150) and to generate an output in the output terminals. Once a SAW filter is fabricated, the central frequency $f_o$ of transmission and the bandwidth (BW) are fixed by the geometry of the filter and by materials used. The only electrical signals that are allowed to reach the output IDT from the input IDT are those with a frequency within the bandwidth of a center frequency $f_o$.

The main properties of piezoelectric materials for filters are: propagation velocity of acoustic waves, electrode pitch and coupling coefficients, where the velocity of acoustic waves and the electrode pitch determine the resonant frequency and the coupling coefficients affect the bandwidth. Velocities values for several piezoelectric substrates are: $LiNbO_3\sim4,000$ m/s, $ZnO\sim6,300$ m/s, $AlN\sim10,400$ m/s and $GaN\sim7,900$ m/s. As an example, to obtain a filter on $LiNbO_3$ with a central frequency $f_o$ of 2 GHz, the wavelength of the acoustic wave is $\lambda=(4000 \text{ msec})/(2\times10^9/\text{sec})=2\times10^{-4}$ cm. Therefore, the value of electrode pitch in FIG. 1 is then equal to $(1/2)\lambda$ or 1 µm. Assuming that the width of electrodes and the space between adjacent electrodes are equal, the electrode width is then 0.5 urn.

Film Bulk Acoustic Wave Resonators (FBAR)

The basic element of the film bulk acoustic wave resonator (FEAR) is a thin film resonator which is very similar to the basic quartz crystal scaled down in size. FIG. 1B shows a schematic cross-sectional diagram of a FBAR (200) on a substrate (160) having a substrate thickness (1601), a piezoelectric film (180) of a thickness (1801) is sandwiched between two metal films (170, 190) having a thickness (170t, 1901 respectively). An air cavity (165) having an air cavity depth (165t) is present to prevent the acoustic waves from getting into the substrate (160). The equivalent Butterworth/VanDyke circuit model consists of a fixed structure capacitance in parallel with a frequency dependant electromechanical resonant circuit. The key properties of the FBAR are set to store the maximum acoustic energy within the structure and to achieve a high electrical Q. The boundary conditions outside of the metal films must maintain a very high level of acoustic reflection with vacuum being the ideal interface. The materials chosen must optimize both electrical and mechanical properties.

Tunable Filters

For mobile communications, there are about 40 bands. More bands are expected for the next generation long term extension technology. For each communication band, there are two frequencies close to each other one for transmitting and the other for receiving. Table 1 gives several selected bands for mobile communications used in different regions or countries. In each band, there is a transmit band or Tx Band at a transmit band central frequency $f_{oTR}$ with a transmit bandwidth $BW_{TR}$. There is also an associated receive band or Rx Band at a receive band central frequency $f_{oRE}$ with a receive bandwidth $BW_{Re}$. The separation between the transmit band and the receive band is given by: $f_{oRE}-f_{oTR}$.

TABLE 1

Band frequencies and bandwidth for some of the Bands assigned to mobile handsets and base stations.

| Band | $f_{oTR}$ (MHz) | $BW_{TR}$ (MHz) | $f_{oRE}$ (MHz) | $BW_{RE}$ (MHz) | $f_{oRE} - f_{oTR}$ (MHz) | Region |
|---|---|---|---|---|---|---|
| 1 | 1920-1980 | 60 | 2110-2170 | 60 | 190 | Asia, EMEA, Japan |
| 2 | 1850-1910 | 60 | 1930-1990 | 60 | 80 | N. America, Latin Am. |
| 3 | 1710-1785 | 75 | 1805-1880 | 75 | 95 | Asia, EMEA |
| 4 | 1710-1755 | 45 | 2110-2155 | 45 | 400 | N. America, Latin Am. |
| 5 | 824-849 | 25 | 869-894 | 25 | 45 | N. America, Latin Am. |
| 7 | 2500-2570 | 70 | 2620-2690 | 70 | 120 | Asia, EMEA |
| 8 | 880-915 | 35 | 925-960 | 35 | 45 | EMEA, Latin Am. |
| 12 | 699-716 | 17 | 729-746 | 17 | 30 | N. America |

Due to the large number of bands used in mobile handsets, a true world phone needs to cover all 40 bands, each with a transmit band and a receive band. Since each RF filter has only one fixed central frequency of resonant and a fixed bandwidth, therefore, such a true world phone will need to have 80 filters for the front end. Due to resource limitations, some designers design mobile phone handsets to cover 5 to 10 bands for selected regions or countries. Even with this reduced number of bands, the number of RF filters currently required is still large (10 to 20 units). Thus, it would be ideal to develop an RF filter which can cover as many bands or frequency ranges as possible so that the size and power consumption of RF front ends in a mobile handset and microwave systems can be reduced. In Table 1, values of $(f_{oRE}-f_{oTR})/f_{oTR}$ are listed. It is seen that majority has a value of 10% or less: mostly ~5%. Therefore, tunable filters with a tuning range of 10% or more will be highly valuable for communications.

In order to fulfill the demands for RF filters covering as many bands or frequency ranges as possible, tunable SAW inter digital transducers and reflectors have been invented and disclosed in U.S. Pat. Nos. 9,437,626 and 9,906,206 by the inventors of the present application. These inventions provide tunable surface acoustic wave resonators utilizing semiconducting piezoelectric layers having embedded or elevated electrode doped regions. Both metallization ratio and loading mass are changed by varying a DC biasing voltage to effect a change in the resonant frequency. A plurality of the present tunable SAW devices may be connected into a tunable and selectable microwave filter for selecting and adjusting of the bandpass frequency or an tunable oscillator by varying the DC biasing voltages.

In U.S. Pat. Nos. 10,312,882 and 9,929,718, frequency tunable FBAR resonators and filters having at least a doped piezoelectric layer are disclosed. The central frequency of resonant is tuned by applying at least a DC biasing voltage.

Modern electronic systems such as: mobile phones, base stations and phase arrays often involve digital signals for computation, processing and representation of parameters such as frequencies. In an RF system involving a resonant frequency based on a voltage-controlled tunable filter, a voltage with a specific magnitude is required. Therefore, in order to use the voltage-controlled tunable RF filter in association with a modern electron system, there is a need to control the digital signals which represent the required resonant frequency and convert them into a DC voltage. This DC voltage is then applied to the voltage-controlled tunable microwave filter to vary the central frequency of the filter.

BRIEF SUMMARY OF THE INVENTION

One object of the invention is to provide tunable film bulk acoustic resonators (FBAR) wherein the central frequency of the acoustic waves to be excited and to be transmitted are tuned by digital to analog converters (DAC) which provide DC bias voltages to the FBAR through integrated thin film bias resistors. Said FBAR may have a structure of MDM, MIDM, MDIM, MDDM, MDIDM or other structures.

One other object of the invention is to provide digital to analog converters (DAC) with output DC voltages controlled by input digital signals, for tuning of the central frequency of the film bulk acoustic resonator (FBAR). The tunable FBAR can be used to form microwave filters, oscillators and switches, with the central frequency of resonance tunable by the input digital signals applied to the digital to analog converter (DAC), for the construction of wireless or microwave systems.

Another object of this invention is to provide a tunable microwave filters with a plurality of tunable series FBARs, a plurality of tunable parallel FBARs, a plurality of coupling capacitors, a plurality of isolation resistors, a first digital to analog convertor DAC1 converts a first input digital signal to a first output DC biasing voltage and a second digital to analog convertor DAC2 converts a second input digital signal to a second output DC biasing voltage to control and select resonant frequencies of the FBARs and to tune and control the central frequency of transmission in the tunable microwave filters.

BRIEF DESCRIPTION OF THE DRAWINGS

FIG. 5C shows a schematic diagram of a tunable 3½ stage ladder microwave acoustic filter (500c) wherein the central frequency $f_{o1}$ of the filter (500c) is controlled by a first digital to analog converter DAC1 (370) and a second digital to analog converter DAC2 (380).

FIG. 5D shows a schematic diagram of a tunable 3⅔ stage ladder microwave acoustic filter (500d) wherein the central frequency $f_{o1}$ of the filter (500d) is controlled by a first digital to analog converter DAC1 (370) and a second digital to analog converter DAC2 (380).

DETAIL DESCRIPTION OF THE INVENTION

Figure 1A:
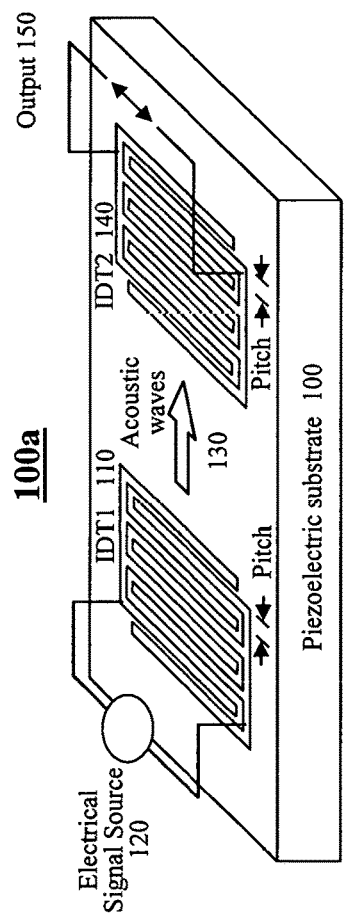
FIG. 1A shows a schematic diagram of a prior art surface acoustic wave filter (100a).
Figure 1B:
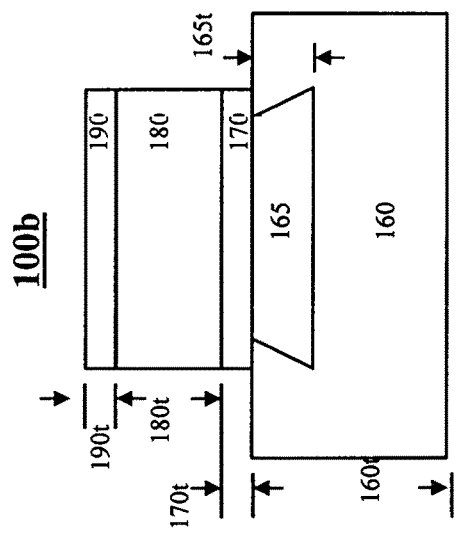
FIG. 1B shows a schematic cross-sectional diagram of a prior art film bulk acoustic resonator FBAR (100b).
Figure 2A:
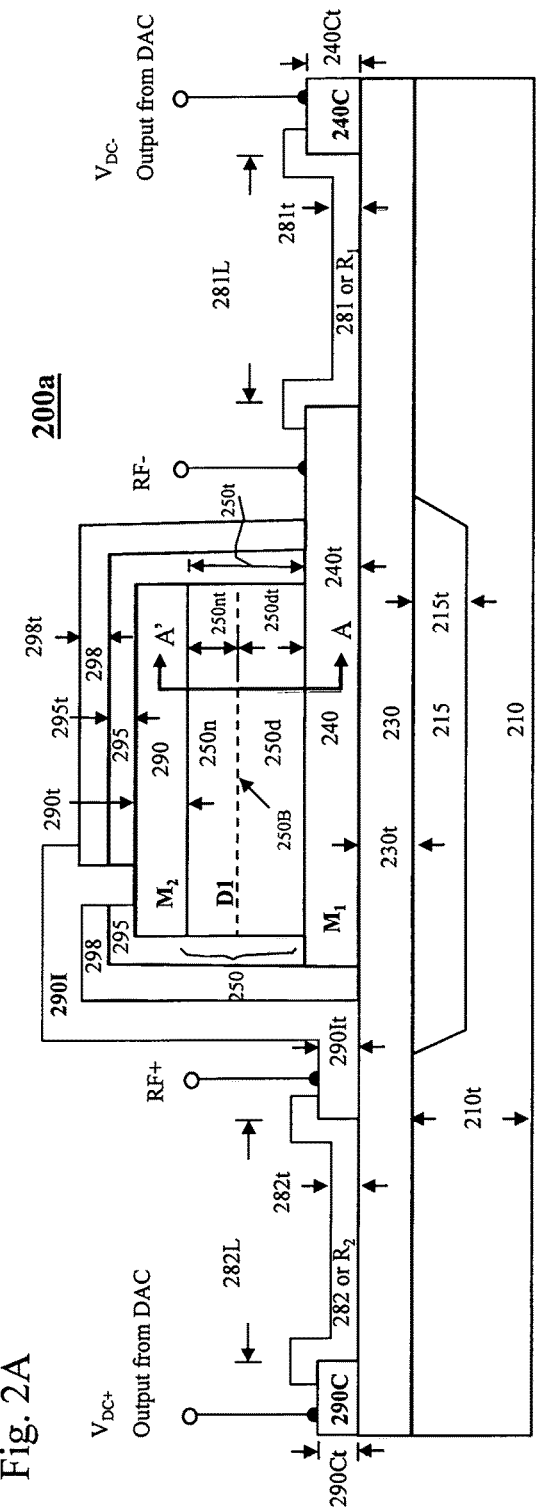
FIG. 2A is a schematic cross-sectional diagram of a frequency tunable $M_1D_1M_2$ (MDM) FBAR (200a) with its resonant frequency controlled by an output DC voltage from a digital to analog converter (DAC), according to the present invention.

MDM FBAR:

FIG. 2A shows a schematic diagram of a portion of an $M_1D_1M_2$ or an MDM FBAR structure (200a) with its resonant frequency controlled by an DC biasing voltage supplied by a digital to analog converter. The MDM structure comprises a first metal electrode $M_1$, a doped piezoelectric semiconductor layer $D_1$ and a second metal electrode $M_2$.

The MDM FBAR structure (200a) in FIG. 2A comprises a bottom substrate (210) with a bottom substrate thickness (210t); an acoustic isolation region (215) having an acoustic isolation region thickness (215t); a bottom support membrane (230) with a bottom support membrane thickness (230t); a first metal electrode $M_1$ (240) having a first metal electrode thickness (240t); a first metal electrode contact (240C) having a first metal electrode contact thickness (240Ct) connected to a negative output terminal of a digital to analog converter (DAC); a first doped piezoelectric semiconductor layer (250) with a first piezoelectric layer thickness (250t), a first piezoelectric doping type (n-type or p-type and preferably to be n-type) and a first piezoelectric doping concentration; a second metal electrode (290) with a second metal electrode thickness (290t); a second metal electrode contact (290C) having a second metal electrode contact thickness (290Ct) connected to a positive output terminal of the digital to analog converter (DAC); a first temperature compensation layer (295) with a first temperature compensation layer thickness (295t) covering the second metal electrode (290) and the first doped piezoelectric semiconductor layer (250) to improve thermal stability of the FBAR; a first passivation layer (298) with a first passivation layer thickness (298t) and a second metal electrode interconnect (290I) with a second metal electrode interconnect thickness (290It), wherein the second metal electrode interconnect (290I) is electrically connected to the second metal electrode (290) through an opening in the first passivation layer (298) and the first temperature compensation layer (295). In (200a), the acoustic isolation region (215) may be an air cavity or a multi layer reflector having a plurality of reflector layers for acoustic wave isolation.

It should be noted that a FBAR with an MDIM or an MIDM structure can be readily obtained by adding an first intrinsic piezoelectric semiconductor layer in the MDM structure (200a). A FBAR with an MDDM structure can also be readily obtained by adding a second doped piezoelectric semiconductor layer in the MDM structure (200a), as disclosed in U.S. Pat. No. 9,929,718. Furthermore, by adding both an first intrinsic piezoelectric layer and a second doped piezoelectric semiconductor layer into the MDM structure, a FBAR with an MDID structure can be easily obtained. For simplicity reasons, only FBARs with a MDM structure will be described here.

In the FBAR structure (200a), a DC potential $V_{DC+}$ from the positive output terminal of the DAC is provided through the second metal electrode contact (290C), the second biasing resistor (282) and the second metal electrode interconnect (290I) to the second metal electrode (290 or $M_2$) and a DC potential $V_{DC-}$ from the negative output terminal of the DAC is provided through the first metal electrode contact (240C), the first biasing resistor (281) to the first metal electrode (240 or $M_1$). $V_{DC+}$ and $V_{DC-}$ generate a first DC voltage $V_1 = V_{DC+} - V_{DC-}$ between the second metal electrode (290 or M2) and the first metal electrode (240 or M1) which creates and regulates a first piezoelectric layer depletion region (250d) with a first piezoelectric layer depletion region thickness (250dt) in the first piezoelectric layer (250), which results in a first piezoelectric neutral region (250n) with a first piezoelectric neutral region thickness (250nt). RF signals ($RF_+$, $RF_-$) are either applied to the first metal electrode (240) and the second metal electrode interconnect (290I) or they are generated in the MDM FBAR (200a) and are obtained from the first metal electrode (240) and the second metal electrode interconnect (290I). It is necessary to point out that in FIG. 2A, the first metal electrode contact (240C) can also be connected to the positive output terminal of the digital to analog converter DAC with the second metal electrode contact (290C) connected to the negative output terminal of the DAC.

A first biasing resistor (281) with a first biasing resistor resistance value $R_1$ and a second biasing resistor with a second biasing resistor resistance value $R_2$ are integrated with the MIDM FBAR for providing a DC bias voltage and an isolation between the RF signal and the DC biasing circuit. The first biasing resistor (281) and the second biasing resistor (282) are preferably an integrated thin film resistor and may have different shapes. When the first resistor (281) is having a rectangular shape, it has a first biasing resistor length $R_{1L}$ (281L), a first biasing resistor width $R_{1W}$ (281W, not shown), a first biasing resistor thickness $R_{1T}$ (281T) and a first biasing resistor sheet resistance $R_{\square 1}$. When the second biasing resistor (282) is selected to have a rectangular shape, it has a second biasing resistor length $R_{2L}$ (282L), a second biasing resistor width $R_{2W}$ (282W, not shown), a second biasing resistor thickness $R_{2T}$ (282T) and a second biasing resistor sheet resistance $R_{\square 2}$. In FIG. 2A, the first biasing resistor (281) connects the first metal electrode (240) to the first metal electrode contact (240C), for the purposes of providing a potential $V_{DC-}$, through (240C) and (281) to the first metal electrode (240 or M₁) and for providing isolation between the RF signals and the digital to analog converter DAC. The second biasing resistor (282) connects the second metal electrode (290 or M2) to the second metal electrode contact (290C) through the second metal electrode interconnect (290I) for DC biasing and RF signals isolation.

The first piezoelectric semiconductor layer (250) has two parts separated by a first piezoelectric depletion region edge (250B): a first piezoelectric depletion region (250d) with a first piezoelectric depletion region thickness (250dt) and a first piezoelectric neutral region (250n) with a first piezoelectric neutral region thickness (250nt). The first piezoelectric neutral region (250n) is electrically conducting with a conductivity approximately proportional to the doping concentration of the first piezoelectric semiconductor layer (250) and the first piezoelectric depletion region (250d) is intrinsic and electrically insulating. In this MIDM FBAR, the first piezoelectric depletion region (250d) make up a piezoelectric active layer to allow interactions between the RF signals and acoustic signals to take place.

Since the interactions between the RF signals and acoustic signals take place mainly in the first piezoelectric depletion region (250d), they are affected by the thickness (250dt) of the first piezoelectric depletion region (250). In view of the fact that the thickness (250dt) is adjustable by varying the polarity or/and the magnitude of the DC voltage ($V=V_{DC+} - V_{DC-}$) applied between the first metal electrode (240) and the second metal electrode (290) through the first and second biasing resistors, therefore, the resonant properties and frequencies of the MDM FBAR structure and any filters, switches or other devices based on the semiconducting piezoelectric layer microwave acoustic effect can be tuned and adjusted by changing the polarity and/or the magnitude of the output DC voltage from the digital to analog converter DAC, according to this invention.

The first biasing resistor thickness $R_{1T}$ and the second biasing resistor thickness $R_{2T}$ are preferably to be less than 2 μm and are more preferably to be less than 0.5 μm to facilitate subsequent pattering either by etching or by lift-off. The sheet resistance $R_{\square 1}$ of the first biasing resistor (281) and the sheet resistance $R_{\square 2}$ of the second biasing resistor (282) are 10 ohms/□ or greater and are preferably 100 ohms/□ or greater to obtain a resistance value $R_1$ and $R_2$ of 1,000 ohms or greater for allowing application of a DC biasing with a sufficient RF isolation. On the other hand, in order to keep a small enough RC product and to reduce unwanted switching delay time for the FBAR, the resistance value $R_2$ and $R_2$ should not be too large.

Materials of the thin film biasing resistors may be metals such as Ni, Cr, Ta, W, Mo, NiCr and their alloys. They may also be metal oxide and metal oxynitride such as ZnO, ZnON, InSnO, InSnON, ZnInO ZnInON, ZnSnO, ZnSnON, RuO₂, TaN, Bi₂Ru₂O₇, RuO₂, Bi₂Ir₂O₇ and other semiconductors such as Si, as long as the sheet resistance of the biasing resistors is large enough and the biasing resistors have stable thermal properties. The layer of the biasing resistors may be deposited by vacuum methods such as evaporation, DC sputtering and RF sputtering in a chamber with Ar gas or with a gas mixture of Ar, O₂ and/or N₂. The first biasing resistor (281) and the second biasing resistor (282) may be fabricated in the same fabrication steps, preferably with the same materials, thickness, composition, and sheet resistance on the bottom support membrane (230) or on the bottom substrate (210). They may also be fabricated in different fabrication steps and have different materials, different thickness, different composition, and different sheet resistance.

Material of the first doped piezoelectric semiconductor layer (250) is selected from a compound material group including: AlN, GaN, AlGaN, ZnO, GaAs, AlAs, AlGaAs as long as they are piezoelectric with sufficient acoustic-electric coupling coefficients and an semiconducting and can be doped to p-type and/or n-type conduction. The first piezoelectric layer thickness (250t) is selected to be in a range of 20 nm to 50 μm, dependent on the acoustic wave velocity in the first piezoelectric semiconductor layer (250) and the first frequency $f_{o1}$ of resonant and a plurality of other resonant frequencies required for the application.

Materials of the bottom substrate (210) may be selected from a group including: Si, GaAs, sapphire, quartz and glass. Materials of the bottom support membrane (230) may be selected from a group including: SiO₂, Si₃N₄, SiON, as long as they have sufficient mechanical strength and low enough attenuation to acoustic waves. Materials of the bottom support membrane (230) and the bottom support membrane thickness (230t) may also be selected to effect a temperature compensation to reduce unwanted shift of resonant frequency due to temperature fluctuation during the operation.

Materials of the first metal electrode contact (240C) may be the same as that of first metal electrode (240) and it is preferably deposited in the same deposition run with the first metal electrode (240). Whereas materials of the second metal electrode contact (290C) and the second metal electrode contact interconnect (290I) may be the same as the second metal electrode (290) and they are preferably deposited in the same deposition run with the second metal electrode (290).

The first metal electrode M₁ (240) and the second metal electrode M₂ (290) in FIG. 2A may have multilayer structures. For the top layer in the first metal electrode M₁ which contacts the first piezoelectric semiconductor layer D₁ (250), the work function is advantageously selected so that M₁ forms a Schottky junction with the first piezoelectric semiconductor layer D₁ (250). The work function of the bottom layer in the second metal electrode M₂ (290) which contacts the first piezoelectric semiconductor layer D₁ (250) is advantageously selected so that M₂ (290) forms an ohmic contact with the first piezoelectric semiconductor layer D₁ (250).

Therefore, for a n-type doped first piezoelectric semiconductor layer D₁ (250), it is preferred to have the work function of the top layer in the first metal electrode (240) to be substantially larger than that of the first piezoelectric semiconductor layer (250). It is also preferred to have the work function of the bottom layer in the second metal electrode (290) to be the same or less than that of the first piezoelectric semiconductor layer (250). Materials for the top layer in the first metal electrode (240) may be selected from a group including Ni, Pt, Pd, Au and their alloys, as long as they have a large enough work function. Whereas materials for the rest of the first metal electrode (240) may be selected from a group including: Mo, Al, Ti, Cu, Au and their alloys to reduce electrical resistance. Materials for the bottom layer in the second metal electrode (290) may be selected from a group including. Ti, Al, W, Mo, Ta, Nb, Ha and their alloys whereas materials for the rest of the second metal electrode (290) may be selected from a group including: Mo, Al, Ti, Cu, Au and their alloys to reduce electrical resistance.

When the first piezoelectric semiconductor D₁ (250) is doped p-type, it is preferred to have the work function of the top layer in the first metal electrode (240) to be substantially less than that of the first piezoelectric semiconductor layer (250). It is also preferred to have the work function of the bottom layer in the second metal electrode (290) to be the same as or larger than that of the first piezoelectric semiconductor layer (250). Materials for the top layer in the first metal electrode (240) may be selected from a group including: Ti, Al, W, Mo, Ta, Nb, Ha and their alloys, as long as they have a small enough work function. Whereas materials for the rest of the first metal electrode (240) may be selected from a group including: Mo, Al, Ti, Cu, Au and their alloys to reduce electrical resistance. Materials for the bottom layer of the second metal electrode (290) may be selected from a group including: Ni, Pt, Pd, Au and their alloys, as long as the work function is large enough. Materials for the rest of the second metal electrode (290) may be selected from a group including: Mo, Al, Ti, Cu, Au and their alloys to reduce electrical resistance.

According to one embodiment of the present invention, the DC biasing and the RF isolation of the MDM FBAR structure can be provided by using only one biasing resistor. If only the first biasing resistor (281) is used, the second metal electrode interconnect (290I) will be directly connected to the second metal electrode contact (290C). On the other hand, if only the second resistor (282) is used, the first metal electrode contact (240C) will be directly connected to the first metal electrode (240). Furthermore, a combination of a biasing resistor and a biasing inductor connected in series can also be used to replace the first or/and the second biasing resistor to provide DC bias voltage to the MDM FBAR structure and an isolation between the RF signal and the digital to analog converter.

Figure 2B:
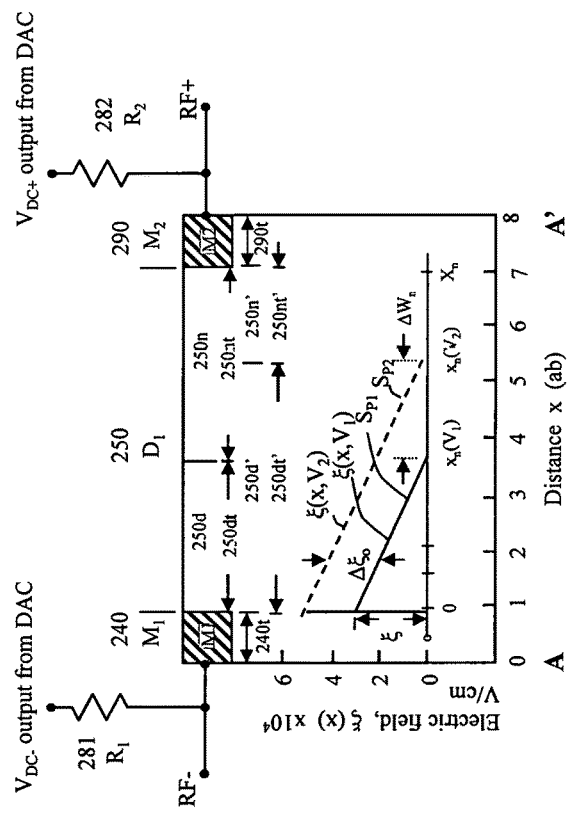
FIG. 2B shows variation of electric field $\xi(x)$ with distance along a line A-A' in the MDM structure (200a) shown in FIG. 2A with an output DC voltage from the digital to analog converter (DAC) applied between the first metal electrode and the second metal electrode through (281, 282) for frequency tuning.

FIG. 2B shows the distribution of electric field magnitude $\xi(x,V)$ with distance along the line A-A' in the MDM structure shown in FIG. 2A. The solid line represents the electric filed magnitude $\xi(x,V_1)$ with a first output DC voltage from the digital to analog converter (DAC), $V_1=V_{DC+}-V_{DC-}$ applied between the first metal electrode (240, M1) and the second metal electrode (290, $M_2$) through (281, 282). The dotted line represents the electric filed magnitude $\xi(x, V_2)$ with a second output DC voltage from the digital to analog converter, $V_2$, applied between (290) and (240) through (281, 282). Under the first output DC voltage from the DAC ($V_1$), the first piezoelectric depletion region (250d) with a first piezoelectric depletion region thickness (250dt) is formed and a first mass loading due to a combination of the first piezoelectric neutral region (250n) and the second metal electrode ($M_2$, 290) yields a first resonant frequency $f_1$. When a second output DC voltage from the DAC, $V_2$, with a larger value is applied between and $M_2$ (290) and $M_1$ (240) through (281, 282), the first piezoelectric depletion region thickness increases from (250dt) to (250dt') which results in a decreased first piezoelectric neutral region thickness (250nt'). These changes give rise to an increased active layer thickness and a second mass loading with a reduced value, as a result of a combination of the new first piezoelectric neutral region (2500 and the second metal electrode (290), which effects resonance of the MDM FBAR at a second resonant frequency $f_2$. In the same fashion, when a third output DC voltage from the DAC, $V_3$, is applied, a third resonant frequency $f_3$ will be created for this MDM FBAR.

Accordingly, a plurality of resonant frequencies may be achieved in the same MDM FBAR (200a) by obtaining a plurality of output DC voltages with different values from the digital to analog converter (DAC) and applying in a sequential manner to the FBAR (200a) through the first biasing resistor (281) and the second biasing resistor (282). Thus, voltage tuning of the resonant frequency is achieved without the requirement of any moving parts in the MDM FBAR. Difference between the second resonant frequency and the first resonant frequency $\Delta f=f_2\ f_t$ for a given output DC bias voltage difference $\Delta V_{DC}=V_2-V_1$ is determined by the first piezoelectric depletion thickness difference $\Delta 250dt=250dt'-250dt=\Delta W_n$ and the change in the mass loading. It should be pointed out that for a first piezoelectric semiconductor layer (250) doped to have a p-type conduction, the electric field distributions should have a positive slope.

As the slopes ($S_{P1}$, $S_{P2}$) of the electric field magnitude curves $\xi(x, V_1)$ and $\xi(x, V_2)$ is proportional to the first piezoelectric doping concentration $N_D$ (for n-type doping) and the value of $\Delta W_n/\Delta V_{DC}$ increases when $N_D$ is decreased, according to this invention, the tuning sensitivity for the resonant frequency of the MDM FBAR (200a) can be enhanced by preferably selecting the first piezoelectric layer doping concentration $N_D$ in a range of $10^{14}$ cm$^{-3}$ to $10^{21}$ cm$^{-3}$ or more preferably by selecting $N_D$ in the range of $10^{15}$ to $10^{20}$ cm$^{-3}$.

The change in the output DC voltage from the digital to analog converter causes a change in the electric field magnitude ($\Delta \xi_o$) and a change in the first piezoelectric depletion region thickness ($\Delta W_n$), here, $\Delta W_n=x_n(V_2)\ x_n(V_1)=250dt'-250dt$. The change in the DAC output DC voltage ($\Delta V_{DC}=V_2-V_1$), is given by the area between the dotted electric field magnitude curve $\xi(x, V_2)$ and solid electric field magnitude curve $\xi(x, V_1)$.

Because the first piezoelectric depletion region (250d) acts as an active region for interactions between the RF signals to be applied (between ($M_1$) and ($M_2$)) and the mechanical acoustic vibrations in the piezoelectric semiconductor layers (250), and also because the thickness of the first piezoelectric depletion region thickness and the mass loading formed by the first piezoelectric layer neutral region (250n) and the second metal electrode $M_2$ (290) varies with the DAC output DC voltage, the resonant frequency of the MDM FBAR (200a) is tuned and adjusted by the DAC output DC voltage. Since the change in the first piezoelectric depletion region thickness $\Delta W_n$ (250dt'-250dt) with the change in the DAC output DC voltage is larger when the first piezoelectric doping concentrations $N_D$ is decreased, therefore, the first piezoelectric doping concentration $N_D$ may also be adjusted according to the need for the tuning sensitivity of the surface acoustic waves frequency. It should be noted that the distribution of doping concentration in the first piezoelectric layer (250) needs not be a constant. A plurality of the tunable MDM FBAR (200a) with integrated biasing resistors, according to this invention may be combined to form a bandpass filter, a switch or a power divider for microwaves or millimetre waves.

For a FBAR with an MDIM or an MIDM structure which can be readily obtained by adding an first intrinsic piezoelectric semiconductor layer in the MDM structure (200a), as disclosed in U.S. Pat. No. 9,929,718. Material of the first intrinsic piezoelectric layer is selected from a compound material group including: AlN, GaN, AlGaN, ZnO, GaAs, AlAs, AlGaAs, LiNbO$_3$, PZT, BaTiO$_3$, quartz and KNbO$_3$ as long as they are piezoelectric with sufficiently large acoustic-electric coupling coefficients and are compatible to the first piezoelectric layer (250). The first intrinsic piezoelectric layer thickness is selected in a range of 20 nm to 50 μm dependent on the acoustic wave velocity in the first intrinsic piezoelectric layer and the first frequency $f_{o1}$ and a plurality of other resonant frequencies required for the applications.

Materials of the temperature compensation layer may be selected from a group of $SiO_2$ and SiON. The first passivation layer (298) may be selected from a material group of: $SiO_2$, $Si_3N_4$, SiON, $HfO_2$, and their mixtures. Materials of the bottom substrate (210) may be selected from a group including: Si, GaAs, sapphire, quartz and glass. Materials of the bottom support membrane (230) may be selected from a group including $SiO_2$, $Si_3N_4$, SiON, as long as they have sufficient mechanical strength and low enough attenuation to acoustic waves. Materials of the bottom support membrane (230) and the bottom support membrane thickness (230t) may also be selected to effect a temperature compensation to reduce unwanted shift of resonant frequency due to temperature fluctuation during the operation.

MIDM FBAR:

To obtain an operation frequency, the value of DC biasing voltage $V_1 = V_{DC+} - V_{DC-}$ in the tunable $M_1 D_1 M_2$ FBAR provided in FIG. 2A may be too high for some mobile devices and the frequency tuning sensitivity may not be sufficiently precise. In order to reduce the required DC biasing voltage value and to improve the tuning sensitivity, a frequency tunable $M_1 I_1 D_1 M_2$ (or MIDM) FBAR structure with frequency controlled by digital to analog converter is provided according to another embodiment of the invention.

Figure 3A:
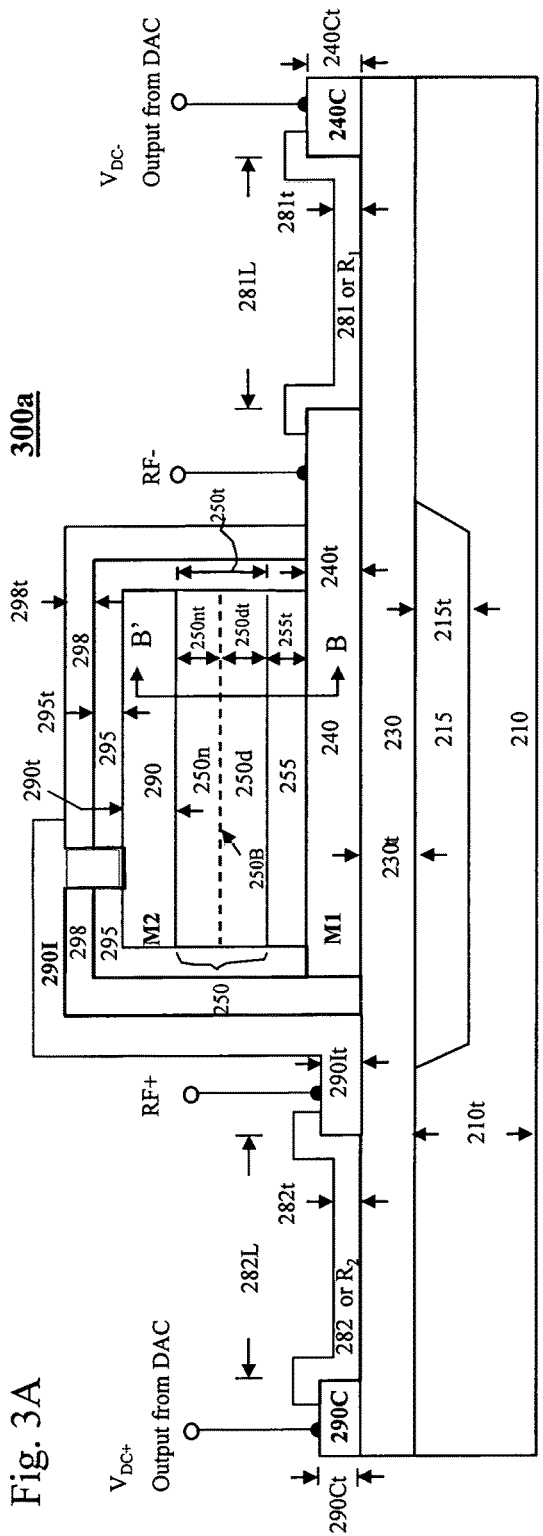
FIG. 3A shows a schematic cross-sectional view of a frequency tunable $M_1T_1D_1M_2$ (MIDM) FBAR (300a) with its resonant frequency controlled by an output DC voltage from a digital to analog converter (DAC), according to the present invention.

FIG. 3A shows a schematic diagram of a portion of an $M_1 I_1 D_1 M_2$ or an MIDM FBAR structure (300a) with integrated biasing resistors which can be obtained by adding an intrinsic piezoelectric layer (255) into the MDM FBAR structure shown in FIG. 2A. It should be noted that a FBAR with an MDIM structure can be readily obtained by switching the intrinsic piezoelectric semiconductor layer with the doped piezoelectric semiconductor layer in the structure. FBARs with a MDIDM structure may as well be obtained by adding a second piezoelectric semiconductor in the MIDM structure as disclosed in U.S. Pat. No. 9,929,718. For simplicity reasons, only MIDM FBAR structure will be selected as an example for the following description.

The MIDM FBAR structure (300a) in FIG. 3A comprises a bottom substrate (210) with a bottom substrate thickness (210t); an acoustic isolation region (215) having an acoustic isolation region thickness (215t); a bottom support membrane (230) with a bottom support membrane thickness (230t); a first metal electrode $M_1$ (240) having a first metal electrode thickness (240t); a first metal electrode contact (240C) having a first metal electrode contact thickness (24000 connected to a negative output terminal of a digital to analog converter (DAC); a first doped piezoelectric semiconductor layer (250) with a first piezoelectric layer thickness (250t), a first piezoelectric doping type and a first piezoelectric doping concentration; a first intrinsic piezoelectric layer (255) with a first intrinsic piezoelectric layer thickness (255t); a second metal electrode (290) with a second metal electrode thickness (290t); a second metal electrode contact (290C) having a second metal electrode contact thickness (290Ct) connected to a positive terminal of the digital to analog converter (DAC); a first temperature compensation layer (295) with a first temperature compensation layer thickness (295t) covering the second metal electrode (290), the first doped piezoelectric semiconductor layer (250) and the first intrinsic piezoelectric layer (255) to improve thermal stability of the FBAR; a first passivation layer (298) with a first passivation layer thickness (298t) and a second metal electrode interconnect (290I) with a second metal electrode interconnect thickness (2904 wherein the second metal electrode interconnect (290I) is electrically connected to the second metal electrode (290) through an opening in the first passivation layer (298) and the first temperature compensation layer (295). In (300a), the acoustic isolation region (215) may be an air cavity or a multi layer reflector having a plurality of reflector layers for acoustic wave isolation.

The first doped piezoelectric semiconductor layer (250) is a doped semiconductor which may be n-type or p-type and preferably to be n-type. The first intrinsic piezoelectric layer (255) is not intentionally doped with a low doping concentration ($10^{13}$ cm$^{-3}$ or less) and is electrically insulating. In the MIDM FBAR structure (300a), a DC potential $V_{DC+}$ from the positive output terminal of the DAC is provided through the second metal electrode contact (290C), the second biasing resistor (282) and the second metal electrode interconnect (290I) to the second metal electrode (290 or $M_2$) and a DC potential $V_{DC-}$ from the negative output terminal of the DAC is provided through the first metal electrode contact (240C), the first biasing resistor (281) to the first metal electrode (240 or $M_1$). $V_{DC+}$ and $V_{DC-}$ generate a first DC voltage $V_1 = V_{DC+} - V_{DC-}$ between the second metal electrode (290 or M2) and the first metal electrode (240 or M1) which creates and regulates a first piezoelectric layer depletion region (250d) with a first piezoelectric layer depletion region thickness (250dt) in the first piezoelectric layer (250), which results in a first piezoelectric neutral region (250n) with a first piezoelectric neutral region thickness (250nt). RF signals ($RF_+$, $RF_-$) are either applied to the first metal electrode (240) and the second metal electrode interconnect (290I) or they are generated in the MIDM FBAR (300a) and are obtained from the first metal electrode (240) and the second metal electrode interconnect (290I). It should be noted that in FIG. 3A, the first metal electrode contact (240C) can also be connected to the positive output terminal of the DAC with the second metal electrode contact (290C) connected to the negative output terminal of the DAC.

A first biasing resistor (281) with a first biasing resistor resistance value $R_1$ and a second biasing resistor with a second biasing resistor resistance value $R_2$ are integrated with the MIDM FBAR for providing a DC bias voltage and an isolation between the RF signal and the DC biasing circuit. The first biasing resistor (281) and the second biasing resistor (282) are preferably an integrated thin film resistor and may have different shapes. When the first resistor (281) is having a rectangular shape, it has a first biasing resistor length $R_{1L}$ (281L), a first biasing resistor width $R_{1W}$ (281W, not shown), a first biasing resistor thickness $R_{1T}$ (281L) and a first biasing resistor sheet resistance $R_{\square 1}$. When the second biasing resistor (282) is selected to have a rectangular shape, it has a second biasing resistor length $R_{2L}$ (282L), a second biasing resistor width $R_{2W}$ (282W, not shown), a second biasing resistor thickness $R_{2T}$ (282T) and a second biasing resistor sheet resistance $R_{\square 2}$. In FIG. 3A, the first biasing resistor (281) connects the first metal electrode (240) to the first metal electrode contact (240C), for the purposes of providing a potential $V_{DC-}$, through (240C) and (281) to the first metal electrode (240 or $M_1$) and for providing isolation between the RF signals and the digital to analog converter DAC. The second biasing resistor (282) connects the second metal electrode (290 or M2) to the second metal electrode contact (290C) through the second metal electrode interconnect (290I) for DC biasing and RF signals isolation.

The first piezoelectric semiconductor layer (250) has two parts separated by a first piezoelectric depletion region edge (250B): a first piezoelectric depletion region (250d) with a first piezoelectric depletion region thickness (250dt) and a first piezoelectric neutral region (250n) with a first piezoelectric neutral region thickness (250*nt*). The first piezoelectric neutral region (250*n*) is electrically conducting and the first piezoelectric depletion region (250*d*) is intrinsic and electrically insulating. In this MIDM FBAR, the first intrinsic piezoelectric layer (255) and the first piezoelectric depletion region (250*d*) make up a piezoelectric active layer to allow interactions between the RF signals and acoustic signals to take place.

Since the interactions between the RF signals and acoustic signals take place mainly in the first piezoelectric depletion region (250*d*) and the first intrinsic piezoelectric layer (255), they are affected by the thickness (250*dt*) of the first piezoelectric depletion region (250). Because that the thickness (250*dt*) is adjustable by varying the polarity or/and the magnitude of the DC biasing voltage ($V=V_{DC+}-V_{DC-}$) applied between the first metal electrode (240) and the second metal electrode (290) through the first and second biasing resistors, the resonant properties and frequencies of the MIDM FBAR structure and any filters, switches or other devices based on the semiconducting piezoelectric layer microwave acoustic effect can be tuned and adjusted by changing the polarity and/or the magnitude of the DC voltage, according to this invention.

The first biasing resistor thickness $R_{1T}$ and the second biasing resistor thickness $R_{2T}$ are preferably to be less than 2 μm and are more preferably to be less than 0.5 μm to facilitate subsequent patterning either by etching or by lift-off. The sheet resistance $R_{\square 1}$ of the first biasing resistor (281) and the sheet resistance $R_{\square 2}$ of the second biasing resistor (282) are 10 ohms/or greater and are preferably 100 ohms/$\square$ or greater to obtain a resistance value $R_1$ and $R_2$ of 1,000 ohms or greater for allowing application of a DC biasing with a sufficient RF isolation. On the other hand, in order to keep a small enough RC product and to reduce unwanted switching delay time for the MIDM FBAR, the resistance value $R_2$ and $R_2$ should not be too large.

Materials of the thin film biasing resistors may be metals such as Ni, Cr, Ta, W, Mo, NiCr and their alloys. They may also be metal oxide and metal oxynitride such as ZnO, ZnON, InSnO, InSnON, ZnInO ZnInON, ZnSnO, ZnSnON, RuO$_2$, TaN, Bi$_2$Ru$_2$O$_7$, RuO$_2$, Bi$_2$Ir$_2$O$_7$ and other semiconductors such as Si, as long as the sheet resistance of the biasing resistors is large enough and the biasing resistors have stable thermal properties. The layer of the biasing resistors may be deposited by vacuum methods such as evaporation, DC sputtering and RF sputtering in a chamber with Ar gas or with a gas mixture of Ar, O$_2$ and/or N$_2$. The first biasing resistor (281) and the second biasing resistor (282) may be fabricated in the same fabrication steps, preferably with the same materials, thickness, composition, and sheet resistance on the bottom support membrane (230) or on the bottom substrate (210). They may also be fabricated in different fabrication steps and have different materials, different thickness, different composition, and different sheet resistance.

According to one embodiment of the present invention, the DC biasing and the RF isolation of the MIDM FBAR structure can be provided by using only one biasing resistor. If only the first biasing resistor (281) is used, the second metal electrode interconnect (290I) will be directly connected to the second metal electrode contact (290C). On the other hand, if only the second resistor (282) is used, the first metal electrode contact (240C) will be directly connected to the first metal electrode (240). Furthermore, a combination of a biasing resistor and a biasing inductor connected in series can also be used to replace the first or/and the second biasing resistor to provide DC bias voltage to the MIDM FBAR structure and an isolation between the RF signal and the digital to analog converter DAC.

Figure 3B:
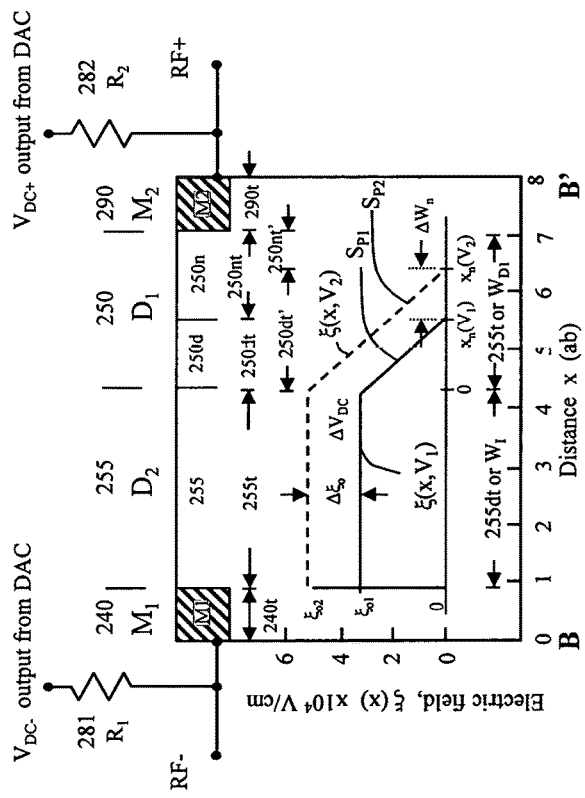
FIG. 3B shows variation of electric field $\xi(x)$ with distance along the line B-B' in the MIDM structure (300a) shown in FIG. 3A with an output DC voltage from the digital to analog converter (DAC) applied between the first metal electrode and the second metal electrode through (281, 282) for frequency tuning.

FIG. 3B shows the distribution of electric field magnitude $\xi(x,V)$ with distance along the line B-B' in the MOM structure shown in FIG. 3A. The solid line represents the electric filed magnitude $\xi(x,V_1)$ with a first output DC voltage from the digital to analog converter DAC, $V_1=V_{DC+}-V_{DC-}$ applied between the second metal electrode (290, M$_2$) and the first metal electrode (240, M$_1$) through (281, 282). The dotted line represents the electric field magnitude $\xi(x, V_2)$ with a second output DC voltage from the DAC, $V_2$, applied between (290) and (240) through (281, 282). Under the first output DC voltage $V_1$ from the DAC, the first piezoelectric depletion region (250*d*) with a first piezoelectric depletion region thickness (250*dt*) is formed and a first mass loading due to a combination of the first piezoelectric neutral region (250*n*) and the second metal electrode (M$_2$, 290) yields a first resonant frequency f$_1$. When a second output DC voltage from the DAC, $V_2$, with a larger value is applied between and M2 (290) and M1 (240) through (281, 282), the first piezoelectric depletion region thickness increases from (250*dt*) to (250*dt'*) which results in a decreased first piezoelectric neutral region thickness (250*nt'*). These changes give rise to an increased active layer thickness and a second mamma loading with a reduced value, as a result of a combination of the new first piezoelectric neutral region (250*n'*) and the second metal electrode (290), which effects resonance of the MIDM FBAR at a second resonant frequency f$_2$. In the same fashion, when a third output DC voltage, $V_3$, is applied, a third resonant frequency f$_3$ will be created for this MIDM FBAR.

Consequently, a plurality of resonant frequencies may be achieved in the same MIDM FBAR (300*a*) by obtaining a plurality of output DC voltages with different values from the digital to analog converter (DAC) and applying them in a sequential manner through the first biasing resistor (281) and second biasing resistor (282) to the MIDM FBAR (300*a*). Thus, voltage tuning of the resonant frequency is achieved without the requirement of any moving parts in the MIDM FBAR. Difference between the second resonant frequency and the first resonant frequency $\Delta f=f_2-f_1$ for a given output DC bias voltage difference $\Delta V_{DC}=V_2-V_1$ is determined by the first piezoelectric depletion thickness difference $\Delta 250dt=250dt'-250dt=\Delta W_n$ and the change in the mass loading. It should be pointed out that for a first piezoelectric semiconductor layer (250) doped to have a p-type conduction, the electric field distributions should have a positive slope.

As the slopes ($S_{P1}$, $S_{P2}$) of the electric field magnitude curves $\xi(x, V_1)$ and $\xi(x, V_2)$ is proportional to the first piezoelectric doping concentration $N_D$ (for n-type doping) and the value of $\Delta W_n/\Delta V_{DC}$ increases when $N_D$ is decreased, according to this invention, the tuning sensitivity for the resonant frequency of the MIDM FBAR (300*a*) can be enhanced by preferably selecting the first piezoelectric layer doping concentration $N_D$ in a range of $10^{14}$ cm$^{-3}$ to $10^{21}$ cm$^{-3}$ or more preferably by selecting $N_D$ in the range of $10^{15}$ to $10^{20}$ cm$^{-3}$.

The change in the output DC voltage from the digital to analog converter causes a change in the electric field magnitude ($\Delta \xi_o$) and a change in the first piezoelectric depletion region thickness ($\Delta W_n$), here, $\Delta W_n=x_n(V_2)-x_n(V_1)=250dt'-250dt$. Due to the existence of the first intrinsic piezoelectric semiconductor layer (255), the change in the DAC output DC voltage ($\Delta V_{DC}=V_2-V_1$), given by the area between the dotted electric field magnitude curve $\xi(x, V_2)$ and solid electric field magnitude curve $\xi(x, V_1)$ is partly dropped across (255). And the area ($\Delta V_{DC}=V_2-V_1$) has two parts: one between the two horizontal lines in the first intrinsic piezoelectric semiconductor layer (255) and the other between the two inclined lines in the first piezoelectric semiconductor layer (250). Hence the same DAC output DC voltage change will cause a smaller change in the $\Delta W_n(=x_n(V_2)-x_n(V_1))$ as compared to the MDM structure shown in FIG. 2A.

Due to the low ion density in the first intrinsic piezoelectric semiconductor layer (255), the electric field magnitude $\xi_{o1}$ required to form a first piezoelectric depletion region thickness (250dt) for achieving the desired resonant frequency could be reduced compared to that in the MDM FBAR structure shown in FIG. 2A. Furthermore, the variation of $x_n(V)$ with the variation of the DAC output DC voltage V would be much less with the presence of the first intrinsic piezoelectric semiconductor layer (255), hence the tuning sensitivity of the resonant frequency by the DC voltage would increase. The MIDM FBAR structure also allows a higher doping concentration for the first piezoelectric semiconductor layer (250) than that for first piezoelectric semiconductor layer in the MDM structure.

Because the first piezoelectric depletion region (250d) and the first intrinsic piezoelectric semiconductor layer (255) act as a combined active region for interactions between the RP signals to be applied (between ($M_1$) and ($M_2$)) and the mechanical acoustic vibrations in the piezoelectric layers (250, 255) and the thickness of the first piezoelectric depletion region varies with the values of the output DC voltage from the DAC, and also because the mass loading formed by the first piezoelectric layer neutral region (250n) and the second metal electrode $M_2$ (290) varies with the DAC output DC voltages, the resonant frequency of the MIDM FBAR (300a) is tuned and adjusted by the output DC voltages from the digital to analog converter (DAC). Since the change in the first piezoelectric depletion region thickness $\Delta W_n$ (250dt'-250dt) with the change in the output DC voltage from the DAC is larger when the first piezoelectric doping concentrations $N_D$ is decreased, therefore, the first piezoelectric doping concentration $N_D$ may also be adjusted according to the need for the tuning sensitivity of the frequency. It should be noted that the distribution of doping concentration in the first doped piezoelectric semiconductor layer (250) need not be a constant. It can be graded, stepped or have other concentration distributions. A plurality of the tunable MIDM FBAR (300a) each with integrated biasing resistors (281) $R_1$ and (282) $R_2$, according to this invention may be combined to form a bandpass filter, a switch or a power divider for microwaves or millimetre waves.

Material of the first piezoelectric semiconductor layer (250) is selected from a compound material group including: MN, GaN, AlGaN, ZnO, GaAs, AlAs, AlGaAs as long as they are piezoelectric with sufficient acoustic-electric coupling coefficients and are semiconducting and can be doped to p-type and/or n-type conduction. Material of the first intrinsic piezoelectric layer (255) is selected from a compound material group including: MN, GaN, AlGaN, ZnO, GaAs, AlAs, AlGaAs, $LiNbO_3$, PZT, $BaTiO_3$, quartz and $KNbO_3$ as long as they are piezoelectric with sufficiently large acoustic-electric coupling coefficients and are compatible to the first piezoelectric layer (250). The first piezoelectric layer thickness (250t) is selected to be in a range of 20 run to 50 µm, dependent on the acoustic wave velocity in the first piezoelectric semiconductor layer (250) and the first frequency $f_{o1}$ of resonant and a plurality of other resonant frequencies required for the application. The first intrinsic piezoelectric layer thickness (255t) is selected in a range of 20 nm to 50 µm dependent on the acoustic wave velocity in the first intrinsic piezoelectric layer and the first frequency $f_{o1}$ and a plurality of other resonant frequencies required for the applications.

To improve thermal stability, a temperature compensation layer (295) with a temperature compensation layer thickness (295t) may be adopted. Materials of the temperature compensation layer may be selected from a group of $SiO_2$ and SiON. The first passivation layer (298) may be selected from a material group of: $SiO_2$, $Si_3N_4$, SiON, $HfO_2$, and their mixtures. Materials of the bottom substrate (210) may be selected from a group including: Si, GaAs, sapphire, quartz and glass. Materials of the bottom support membrane (230) may be selected from a group including $SiO_2$, $Si_3N_4$, SiON, as long as they have sufficient mechanical strength and low enough attenuation to acoustic waves. Materials of the bottom support membrane (230) and the bottom support membrane thickness (230t) may also be selected to effect a temperature compensation to reduce unwanted shift of resonant frequency due to temperature fluctuation during the operation.

A plurality of the tunable FBAR (200d) with an MIDM structure each with integrated biasing resistors (281) $R_1$ and (282) $R_2$ according to this invention may be combined to form a band pass filter, switch, power divider for microwaves or millimetre waves. Furthermore, FBAR structures of MDM, MDDM MDIDM and others as disclosed in U.S. patent application Ser. No. 15/330,313, may well be adopted to achieve the frequency tuning functions.

MDDM FBAR:

It has been stated before that a FBAR with an MDDM structure can be readily obtained by adding a second doped piezoelectric semiconductor layer in the MDM structure (200a) in FIG. 2A, as disclosed in U.S. Pat. No. 9,929,718. Furthermore, by adding both an first intrinsic piezoelectric layer and a second doped piezoelectric semiconductor layer into the MDM structure, a FBAR with an MDIDM structure can be easily obtained.

Figure 4A:
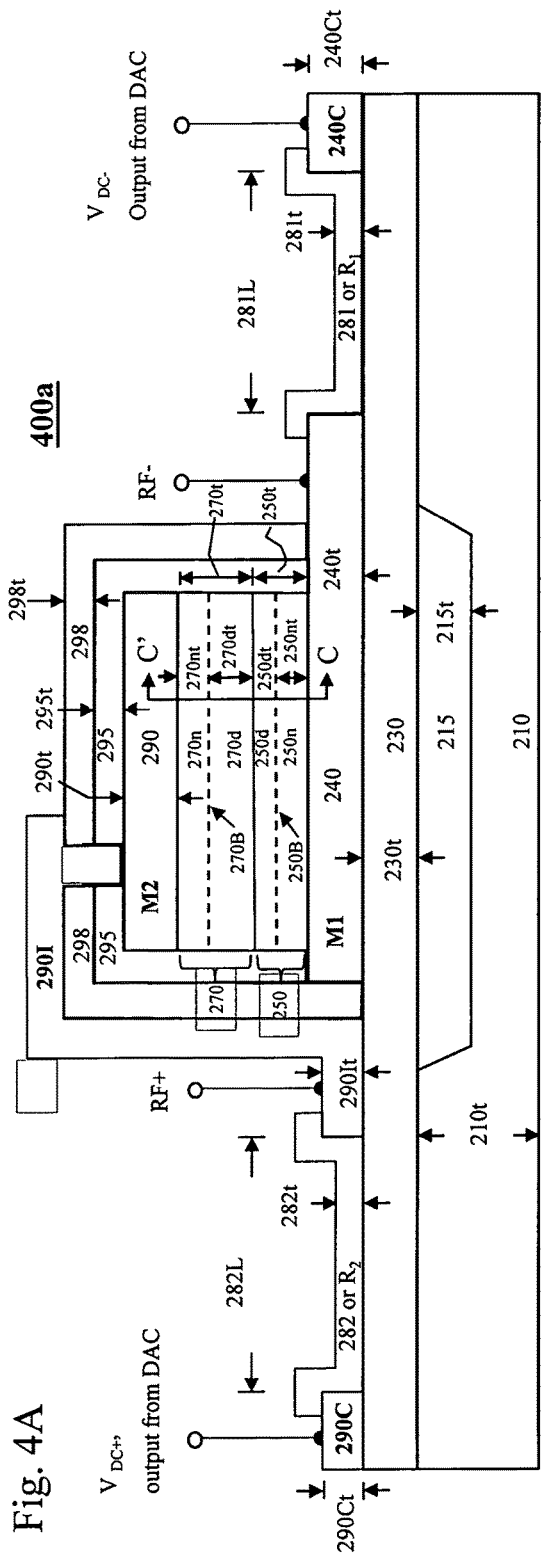
FIG. 4A is a schematic cross-sectional view of a frequency tunable $M_1D_1D_2M_2$ FBAR (400a) with its resonant frequency controlled by an output DC voltage from a digital to analog converter (DAC), according to the present invention.

In a FBAR with an MDDM structure as shown in FIG. 4A, which is obtained by including an second doped piezoelectric semiconductor layer in above MDM structure (200a), the second doped piezoelectric semiconductor layer (270) having a second doped piezoelectric layer thickness (270t), a second piezoelectric layer doping type which is opposite to the first piezoelectric layer doping type of the first doped piezoelectric semiconductor layer (250), and a second piezoelectric layer doping concentration.

In FIG. 4A, under the biasing DC voltage provided by the digital to analog converter, the first piezoelectric semiconductor layer (250) is separated by a first piezoelectric depletion region edge (250B) into two regions: a first piezoelectric depletion region (250d) with a first piezoelectric depletion region thickness (250dt) and a first piezoelectric neutral region (250n) with a first piezoelectric neutral region thickness (250nt). The second piezoelectric semiconductor layer (270) is separated by a second piezoelectric depletion region edge (270B) into two regions: a second piezoelectric depletion region (270d) with a second piezoelectric depletion region thickness (270dt) and a second piezoelectric neutral region (270n) with a second piezoelectric neutral region thickness (270nt). The first piezoelectric neutral region (250n) and the second piezoelectric neutral region (270n) are electrically conducting and the first piezoelectric depletion region (250d) and the second piezoelectric depletion region (270d) are intrinsic and electrically insulating. In this MDDM FBAR, the first piezoelectric depletion region (250d) and the second piezoelectric depletion Legion (270d) constitute a combined piezoelectric active layer to allow interactions between the RF signals and the acoustic signals to occur.

Since the interactions between the RF signals and acoustic signals take place mainly in the first piezoelectric depletion region (250d) and the adjacent second piezoelectric depletion region (270d), they are affected by the thicknesses (250dt, 270dt) of the first piezoelectric depletion region (250) and the second piezoelectric depletion region (270dt). Given that (250d0 and (270dt) are adjustable by varying the polarity or/and the magnitude of the DC biasing voltage (from the DAC) and applied between the first metal electrode (240) and the second metal electrode (290), therefore, the resonant properties and frequencies of the MDDM FBAR structure and any filters, switches or other devices based on the semiconducting piezoelectric layers microwave acoustic effect can be tuned and adjusted by changing the polarity and/or the magnitude of the DC voltage according to this invention.

Figure 4B:
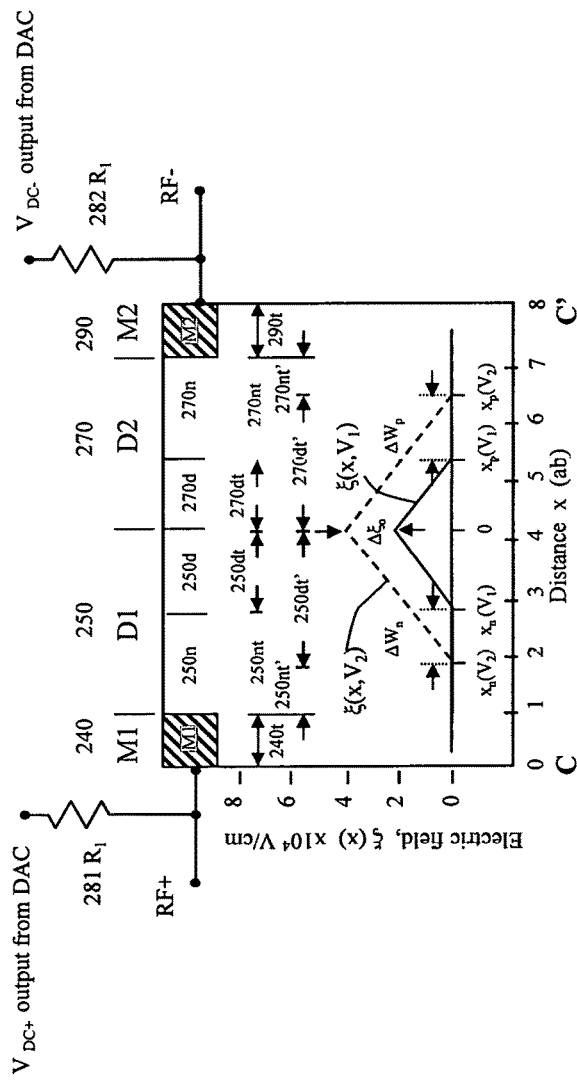
FIG. 4B shows variation of electric field $\xi(x)$ with distance along the line C-C' in the MDDM structure (400a) shown in FIG. 4A with an output DC voltage from the digital to analog converter (DAC) applied between the first metal electrode and the second metal electrode through (281, 282) for frequency tuning.

FIG. 4B shows the distribution of the electric field magnitude with distance along the line C-C' in the MDDM FBAR structure in FIG. 4A. The solid line represents the electric filed magnitude $\xi(x, V_1)$ with the first output DC voltage from the digital to analog converter, $V_1=V_{DC+}-V_{DC-}$ applied between the second metal electrode (290 or $M_2$) and the first metal electrode (240 or $M_1$) through (281, 282). The dotted line represents the electric filed magnitude $\xi(x, V_2)$ with a second output DC voltage from the DAC, $V_2$, applied between (290) and (240) through (281, 282). It is noted that the maximum electrical field occurs at the interface between the first doped piezoelectric layer and second doped piezoelectric layer. Under the first output DC voltage $V_1$, the first piezoelectric depletion region (250d) of a thickness (250dt) and the second piezoelectric layer depletion region (270d) of a thickness (270dt) together with a first mass loading due to a combination of the first piezoelectric neutral region (250n) of a thickness (250nt), the second piezoelectric neutral region (270n) of a thickness (270nt) and the second metal electrode ($M_2$, 290) yield a first resonant frequency $f_1$. When a second output DC voltage, $V_2$, with a larger value is applied, the electric field magnitude in the first piezoelectric depletion region (250d) and in the second piezoelectric depletion region (270d) increases to give new electric field distribution $\xi(x,V_2)$. This change gives rise to a new first piezoelectric depletion region (250d') with a new first piezoelectric depletion region thickness (250dt), a new first piezoelectric neutral region (250n') with a new first piezoelectric neutral region thickness (250nt'), a new second piezoelectric depletion region (270d') with a new second piezoelectric depletion region thickness (270dt') and a new second piezoelectric neutral region (270n') with a new second piezoelectric neutral region thickness (270nt'). This results in increased thicknesses (250dt', 270dt') for the first and second piezoelectric depletion regions (250d', 270d') and decreased thicknesses (250nt', 270nt') for the first and the second piezoelectric neutral regions (250n, 270n), hence an increased combined piezoelectric active layer thickness. Together with a second mass loading with a decreased value as a result of a combination of the new first piezoelectric neutral region (250n), the new second piezoelectric neutral region (270n') and the second metal electrode (290), the increased combined piezoelectric active layer thickness effects resonance of the MDDM FBAR (300a) at a second resonant frequency $f_2$. When a third DC biasing voltage $V_3$ is applied, a third resonant frequency $f_3$ will be created for the MDDM FBAR Accordingly, a plurality of resonant frequencies may be achieved in the same MDDM FBAR (400a) by obtaining a plurality of output DC voltages with different values from the digital to analog converter and applying in a sequential manner to the MDDM FBAR through the first biasing resistor (281) and the second biasing resistor (282). Thus, voltage tuning of the resonant frequency is achieved without the requiring any moving parts in the MDDM FEAR.

As the magnitude for the slopes of the electric distribution curves $\xi(x, V_1)$ and $\xi(x, V_2)$ in the first piezoelectric depletion region (250d, 250d') is proportional to the first piezoelectric layer doping concentration, whereas the magnitude for the slopes of electric distribution curves $\xi(x, V_1)$ or $\xi(x, V_2)$ in the second piezoelectric depletion region (270, 270d') is proportional to the second piezoelectric layer doping concentration, thus the first piezoelectric layer doping concentration and the second piezoelectric layer doping concentration may be preferably adjusted according to the required frequency tuning sensitivity for the surface acoustic waves in the MDDM FBAR. The tuning sensitivity for the resonant frequency of the MDDM FBAR (400a) is enhanced with the first piezoelectric layer doping concentration and the second piezoelectric layer doping concentration to be selected in a range of $10^{14}$ cm$^{-3}$ to $10^{21}$ cm$^{-3}$ or to be more preferably selected in the range of $10^{15}$ to $10^{20}$ cm$^{-3}$. It is noted that the distribution of doping concentration in the first piezoelectric semiconductor layer (250) and the distribution of doping concentration in the second piezoelectric semiconductor layer (270) need not to be a constant. It can be graded, stepped or have other concentration distributions.

The first and the second doped piezoelectric semiconductor layers (250, 270) are selected from a material group including: AlN, GaN, AlGaN, ZnO, GaAs, AlAs, AlGaAs, as long as they are piezoelectric with sufficient acoustic coupling coefficients, are semiconducting and can be doped to p-type and/or n-type conduction. The first piezoelectric layer thickness (250t) and the second piezoelectric layer thickness (270t) are selected in a range of 20 nm to 50 µm dependent on the acoustic wave velocity in the first piezoelectric layer, the acoustic wave velocity in the second piezoelectric layer, the first frequency $f_{o1}$ and a plurality of other resonant frequencies required for the applications.

Tunable FBAR Microwave Filter Circuits

According to one embodiment of this invention, a plurality of tunable FBAR resonators are connected and biased by output DC voltages from digital to analog converters, for forming a FBAR filter with tunable or adjustable resonant frequencies.

Figure 5A:
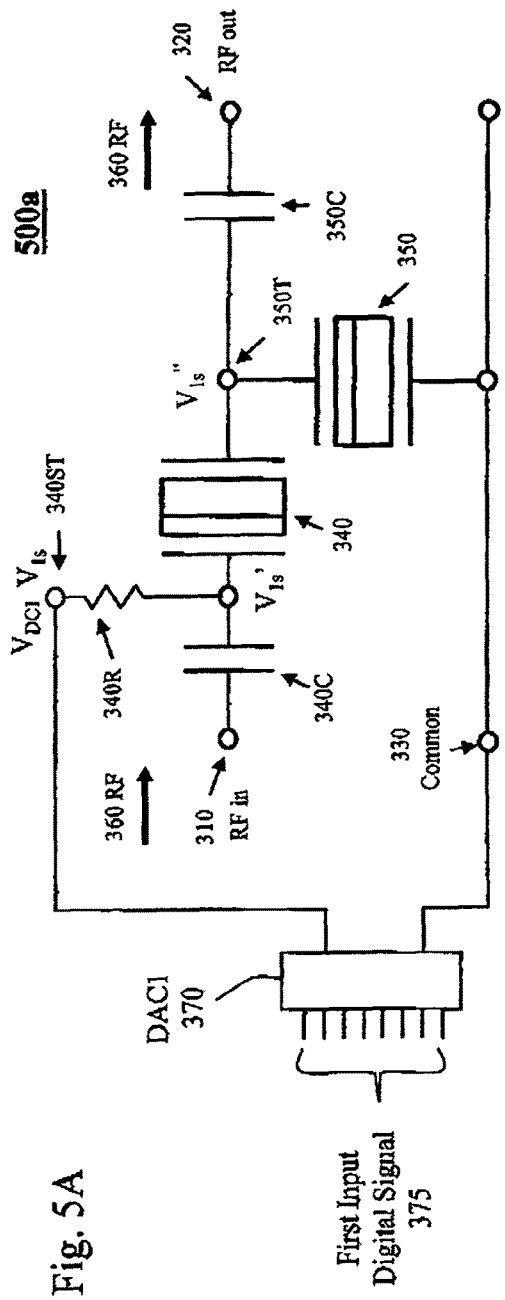
FIG. 5A shows a schematic diagram of a tunable microwave filter circuit (500a) wherein the central frequency of the filter (500a) is controlled by a first digital to analog converter (DAC) (370).

FIG. 5A is a schematic diagram showing two tunable FBAR resonators connected to form a microwave filter circuit (500a). This filter circuit (500a) comprises a first series resonator (340) and a second parallel or shunt resonator (350) connected at a first contact point (3501); a first coupling capacitor (340C) and a second coupling capacitor (350C) connected to an first RF input contact (310) and an second RF output contact (320) respectively for blocking DC voltages; a first isolation resistor (340R) for isolation of RF signals; and a first digital to analog converter DAC1 (370). DAC1 (370) converts the first input digital signal (375) and produces a first output DC voltage $V_{DC1}$ having a voltage value and a polarity. One output terminal of the DAC1 is connected to the isolation resistor (340R) at a first source point (340ST) and the other output terminal of the DAC1 is connected to a common ground point (330).

When a first input digital signal is applied to the first digital to analog converter DAC1 (370) to produce a first output DC voltage $V_{DC1}$ with a value $V_{1s}$ applied between the source point (340ST) and the common ground point (330), a first DC voltage $V_{1s}'$ is applied across the combination of the first series resonator (340) and the second parallel resonator (350) through the first isolation resistor (340R) to establish biasing of the two resonators (340, 350). The bias voltage across the second resonator (350) is $V_{1s''}$ and the bias voltage across the first resonator (340) is given by $V_{1s'}-V_{1s''}$. The biasing voltages control the resonant central frequency $f_{o1}$ and effect transmission of a RF signals (360) applied to a first RF input contact (310) so that microwave signals at and around the central frequency $f_{o1}$ and within the bandwidth of the filter circuit (500a) are allowed to propagate through the first series resonator (340) and to reach an second RF output contact (320). The transmission central frequency $f_{o1}$ of microwaves is selected or controlled by the first input digital signal applied to the DAC1 which regulates value of the first output DC voltage $V_{DC1}$ according to this invention. In the microwave filter circuit (500a), a single first digital to analog converter (370) and a single isolation resistor (340R) is adopted to provide output DC voltage $V_{DC1}$ and provide biasing for the first series resonator (340) and the second parallel resonator (350).

Figure 5B:
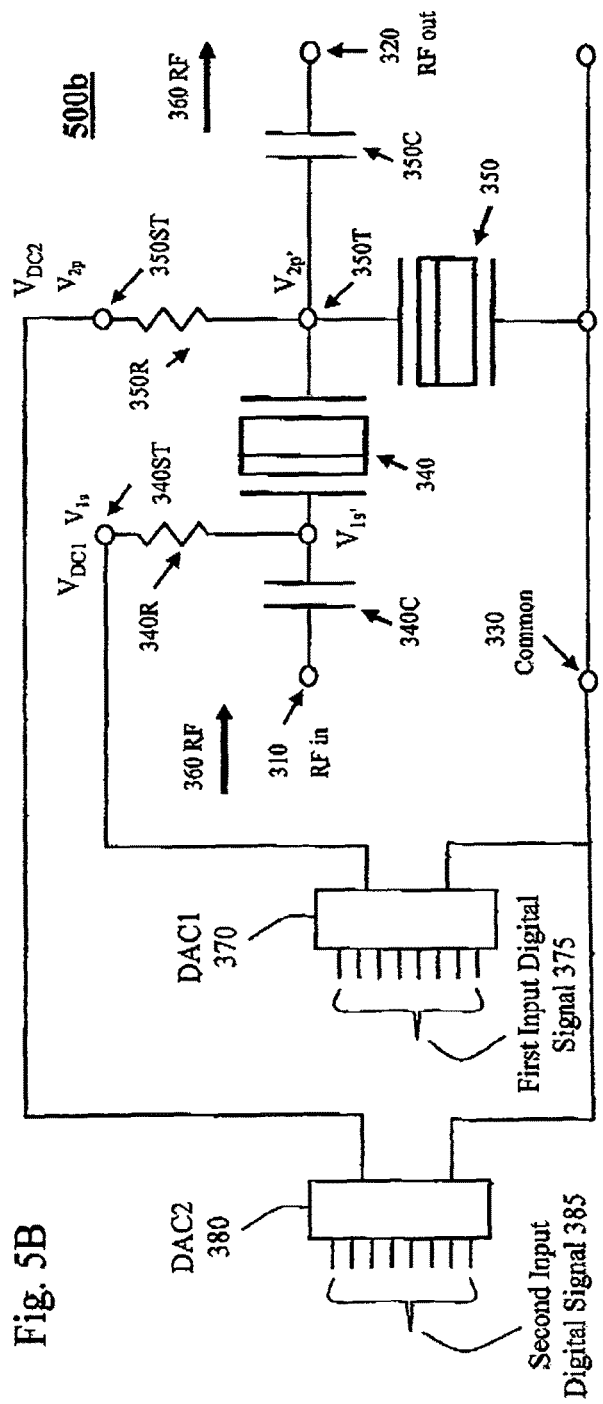
FIG. 5B shows a schematic diagram of a tunable microwave filter circuit (500b) wherein the central frequency $f_{o1}$ of the filter (500b) is controlled by a first digital to analog converter DAC1 (370) and a second digital to analog converter DAC2 (380).

FIG. 5B is a schematic diagram showing two tunable FBAR resonators connected to form a microwave filter circuit (500b) according to this invention. The microwave filter circuit (500b) comprises a first series resonator (340) and a second parallel or shunt resonator (350) connected at a first contact point (3507); a first coupling capacitor (340C) and a second coupling capacitor (350C) for blocking DC voltages; a first isolation resistor (340R) and a second isolation resistor (350R) for isolation of RF signals; a first digital to analog converter DAC1 (370) with output terminals connected to a first source point (340ST) and a common ground point (330) to convert a first input digital signal (375) to a first output DC voltage $V_{DC1}$ having a polarity and a voltage value; a second digital to analog converter DAC2 (380) with output terminals connected to a second source point (350ST) and the common ground point (330) to convert a second input digital signal (385) to a second output DC voltage $V_{DC2}$ having a polarity and a voltage value.

Two digital to analog converters are adopted in the filter circuit (500136) to maintain biasing of the first series resonator (340) and the second parallel resonator (350). When a first input digital signal is applied to the first digital to analog converter DAC1 (370) to produce a first output DC voltage $V_{DC1}$ with a first voltage value $V_{1s}$ applied between the first source point (340ST) and the common ground point (330), a first DC voltage $V_{1s'}$ is applied through the first isolation resistor (340R) across the combination of the first series resonator (340) and second parallel resonator (350) to establish biasing of the two resonators (340, 350). When a second input digital signal is applied to the second digital to analog converter DAC2 (380) to produce a second output DC voltage $V_{DC2}$ with a second voltage value $V_{2p}$ applied between the second source point (350ST) and the common ground point (330). This second DC voltage $V_{2p}$ is applied across the second isolation resistor (350R) and the second parallel resonator (350) to establish biasing of the resonator (350). The bias voltage across the second resonator (350) is $V_{2p'}$ and the bias voltage across the first resonator (340) is then given by $V_{1s'}-V_{2p'}$. The first DAC1 and second DAC2 produces output DC voltages to control the resonant central frequency $f_{o1}$ and effect transmission of RF signals (360) applied to a first RF input contact (310) so that microwaves signals at and around the central frequency $f_{o1}$ and within the bandwidth of the filter circuit (500b) are allowed to propagate through the first series resonator (340) to reach an RF output contact (320).

Since the first input digital signal regulates value of the first output DC voltage $V_{DC1}$ and the second input digital signal regulates value of the second output DC voltage $V_{DC2}$, therefore, the central frequency $f_{o1}$ of transmission of microwaves is selected or controlled by the first input digital signals applied to the DAC1 and by the second input digital signals applied to the DAC2. By changing digital signals to DAC1 and/or DAC2 and thus the first DC voltage value $V_{1s}$ and the second DC voltage value $V_{2p}$, the biasing voltage across the first series, resonator (340) and the second parallel resonator (350) can be controlled separately.

FIG. 5C shows a schematic diagram of a 3½ stage ladder filter (500c) for microwaves according to this invention. The 3½ stage ladder filter (500c) comprises first series resonators (340-1, 340-2, 340-3); second parallel resonators (350-1, 350-2, 350-3, 350-4); first coupling capacitors (340-0C, 340-1C, 340-2C, 340-3C) and a second coupling capacitor (350-4C) for blocking of DC voltages; first isolation resistors (340-1R, 340-2R, 340-3R) and a second isolation resistor (350-1R) for isolation of RF signals; a first digital to analog converter DAC1 (370) with output terminals connected to first source points (MOST) and a common ground point (330) to convert a first input digital signal (375) to a first output DC voltage $V_{DC1}$ with voltage values of $V_{1s}$, $V_{2s}$, and $V_{3s}$ to be applied at the first source points (340ST); a second digital to analog converter DAC2 (380) with output terminals connected to a second source point (350ST) and the common ground point (330) to convert a second input digital signal (385) to a second output DC voltage $V_{DC2}$ with a voltage value $V_{0p}$ to be applied at the second source point (350ST). In this 3½ stage ladder filter (500c), each pair of the series resonator and the parallel resonator is connected at a first contact point (340-1T, 340-2T, 340-3T) and the second parallel resonator (350-1) is connected to the first coupling capacitor (340-0C) and the second isolation resistor (350-1R) at a second contact point (350-1T).

In the filter (50(k), DAC1 (370) is a single digital to analog converter which produces output DC voltage $V_{DC1}$ with a voltage value of $V_{1s}$ or $V_{2s}$, or $V_{3s}$. The DAC1 (370) could also be replaced by three digital to analog converters, each independently connects to the isolation resistors (340-1R), (340-2R) and (340-3R) to provide biasing voltages $V_{1s}=V_{2s}=V_{3s}$, either with different values (i.e. $V_{1s} \neq V_{2s} \neq V_{3s}$) or with the same value (i.e. $V_{1s}=V_{2s}=V_{3s}$) to each pair of series resonator and corresponding parallel resonator (340-1 and 350-2, 340-2 and 350-3, 340-3 and 350-4). The second output DC voltage $V_{DC2}$ with a voltage value of $V_{0p}$ from the second digital to analog converter DAC2 (380) is applied to the second parallel resonator (350-1) through the second isolation resistor (350-1R) to establish biasing to the second parallel resonator (350-1).

The biasing voltages control the central frequency $f_{o1}$ of the 3½ stage ladder filter (500c) and effect transmission of a RF signal (360) applied to a first RF input contact (310) so that microwaves signals at and around the central frequency $f_{o1}$ and within the bandwidth of the filter are allowed to propagate through the first resonators (340-1, 340-2, 340-3) to reach an RF output contact (320). The transmission central frequency $f_{o1}$ is selected or controlled by setting first input digital signals applying to DAC1 hence first output DC voltage $V_{DC1}$, and by setting second input digital signals applying to DAC2 and hence second output DC voltage $V_{DC2}$, according to this invention. Additional inductors or resistors may be added between each second parallel resonator (350-1, 350-2, 350-3 and 350-4) and the Common ground.

FIG. 5D is a schematic diagram of a 3½ stage ladder filter (500d) for microwaves according to this invention. The stage ladder filter (500d) comprises first series resonators (340-1, 340-2, 340-3); second parallel resonators (350-1, 350-2, 350-3, 350-4); first coupling capacitors (340-0C, 340-1C, 340-2C, 340-3C) and a second coupling capacitor (350-4C) for blocking DC voltages; first isolation resistors (340-1R, 340-2R, 340-3R) and second isolation resistors (350-1R, 350-2R, 350-3R, 350-4R) for isolation of RF signals; a first digital to analog converter DAC1 (370) with output terminals connected for first source points (340ST) and a common ground point (330) to convert a first input digital signal (375) to a first output DC voltage $V_{DC1}$ with voltage values of $V_{1s}$, $V_{2s}$, $V_{3s}$ to be applied at the first source points (340ST); a second digital to analog converter DAC2 (380) with output terminals connected to a second source point (350ST) and the common ground point (330) to convert a second input digital signal (385) to a second DC voltage $V_{DC2}$ with voltage values of $V_{0p}$, $V_{1p}$, $V_{2p}$, $V_{3p}$. In the stage ladder filter (400d) to be applied at the second source point (350ST). In this 3½ stage ladder filter (500d), each pair of the series resonator and the parallel resonator (340-1 and 350-2), (340-2 and 350-3), and (340-3 and 350-4) is connected at a first contact point (340-1T), (340-2T), and (340-3T) and respectively. The second parallel resonator (350-1) is connected to the first coupling capacitor (340-0C) and the second isolation resistor (350-1R) at a second contact point (350-1T).

In the filter (500d), the first digital to analog converter DAC1 (370) is a single digital to analog converter which produces first output DC voltage $V_{DC1}$ with voltage values $V_{1s}=V_{2s}=V_{3s}$. The DAC1 (370) could also be replaced by three digital to analog converters, each independently connects to the first isolation resistors (340-11Z), (340-2R) and (340-3R) to provide biasing voltages $V_{1s}$, $V_{2s}$, and $V_{3s}$ either with different values (i.e. $V_{1s} \neq V_{2s} \neq V_{3s}$) or with the same values (i.e. $V_{1s}=V_{2s}=V_{3s}$) to each pair of first series resonator and corresponding second parallel resonator (340-1 and 350-2), (340-2 and 350-3), and (340-3 and 350-4).

The second digital to analog converter DAC2 (38) is a single digital to analog converter which produces second output DC voltage $V_{DC2}$ with voltage values $V_{0p}$ or $V_{1p}$, or $V_{2p}$ or $V_{3p}$. It may also be replaced by four digital to analog converters, each independently connects to the second isolation resistors (350-1R), (350-2R), (350-3R), and (350-4R) to provide biasing voltages $V_{0p}$, $V_{1p}$, $V_{2p}$, and $V_{3p}$ either with different values (i.e. $V_{0p} \neq V_{1p} \neq V_{2p} \neq V_{3p}$) or with the same values (i.e. $V_{0p}=V_{1p}=V_{2p}=V_{3p}$) to each of the second parallel resonator (350-1, 350-2, 350-3, and 350-4).

The first digital to analog converter DAC1 (370) converts the first input digital signal (375) to a first output DC voltage $V_{DC1}$ with voltage values $V_{1s}$, $V_{2s}$, $V_{3s}$ which is applied through the first isolation resistors (340-1R, 340-2R, 340-3R) across each pair of the first series resonators and the corresponding second parallel resonators (340-1 and 350-2), (340-2 and 350-3), and (340-3 and 350-4) to establish biasing of the first series resonators (340-1, 340-2, 340-3) and the second parallel resonators (350-2, 350-3, 350-4). The second digital to analog converter DAC2 (380) converts the second input digital signal (385) to a second output DC voltage $V_{DC2}$ with voltage values of $V_{0p}$, $V_{1p}$, $V_{2p}$, $V_{3p}$ which is applied through the second isolation resistors (350-1R, 350-2R, 350-3R and 350-4R) across each second parallel resonator (350-1, 350-2, 350-3 and 350-4) to establish biasing of the second parallel resonators.

The biasing voltages control the central frequency $f_a$ of the 3½ stage ladder filter (500d) and effect transmission of a RF signal (360) applied to a first RF input contact (310) so that microwaves signals at and around the central frequency $f_{o1}$ and within the bandwidth of the filter (500d) are allowed to propagate through the first series resonators (340-1, 340-2, 340-3) to reach an RF output contact (320). The microwave transmission central frequency $f_{o1}$ is selected or controlled by adjusting the first input digital signals applying to DAC1 and hence value of the first output DC voltage $V_{DC1}$ and by adjusting the second input digital signals applying to DAC2 and hence value of the second output DC voltage $V_{DC2}$, according to this invention. Additional inductors may be added between each second parallel resonator and the common ground.

In (500d), since the first input digital signal regulates value of the first output DC voltage $V_{DC1}$ and the second input digital signal regulates value of the second output DC voltage $V_{DC2}$, therefore, the central frequency $f_{o1}$ of transmission of microwaves is selected or controlled by the first input digital signals applied to the DAC1 and by the second input digital signals applied to the DAC2. By changing digital signals to DAC1 and/or DAC2 and thus the first DC voltage value ($V_{1s}$, $V_{2s}$, and $V_{3s}$) and the second DC voltage value ($V_{0p}$, $V_{1p}$, $V_{2p}$, $V_{3p}$ and $V_{2p}$), the biasing voltage across the series resonators (340-0, 340-1, 340-2, 340-3) and the second parallel resonator (350-1, 350-2, 350-3 and 350-4) can be controlled separately.

What is claimed is:

1. A tunable film bulk acoustic resonator FBAR with resonant frequency tuned and controlled by a digital to analog converter comprises:

the digital to analog converter having at least a first digital to analog converter to convert a first input digital signal to a first output DC voltage with a value for providing biasing voltages to said FBAR and for tuning of said resonant frequency-, the FBAR comprising a bottom substrate;

an acoustic isolation region;

a bottom support membrane;

a first metal electrode;

a first metal electrode contact connected to one output terminal of said digital to analog converter;

a second metal electrode;

a second metal electrode contact connected to another output terminal of said digital to analog converter;

a first doped piezoelectric semiconductor layer with a first piezoelectric layer thickness, a feat piezoelectric layer doping type and a first piezoelectric layer doping concentration, wherein said first doped piezoelectric semiconductor layer is sandwiched between said first metal electrode and said second metal electrode forming a Metal-Doped piezoelectric semiconductor-Metal (MDM) structure;

a first passivation layer;

a second metal electrode interconnect connected to said second metal electrode through an opening in said first passivation layer; and a first biasing resistor with a first biasing resistor resistance value and a second biasing resistor with a second biasing resistor resistance value, wherein said first biasing resistor connects said first metal electrode to said first metal electrode contact and said second biasing resistor connects said second metal electrode interconnect to said second metal electrode contact so that said first output DC voltage effects a DC biasing voltage between said first metal electrode and said second metal electrode, said DC biasing voltage creates a first piezoelectric depletion region with a first piezoelectric depletion region thickness and a first piezoelectric neutral region with a first piezoelectric neutral region thickness in said first doped piezoelectric semiconductor layer and forms a piezoelectric active layer to effect interactions between RF signals and mechanical vibrations, a change in said first input digital signal causes a change in said output DC voltage from said digital to analog converter and a change in said DC biasing voltage and thus causes a change in said first piezoelectric depletion region thickness and a change in mass loading associated with said first piezoelectric neutral region and hence effect a change in said resonant frequency of said film bulk acoustic resonator.

2. The tunable FBAR of claim 1, wherein material of said first doped piezoelectric semiconductor layer is selected from a group including: AlN, GaN, AlGaN, ZnO, GaAs, AlAs, and AlGaAs.

3. The tunable FBAR of claim 1, wherein said first piezoelectric layer doping concentration is controlled to be in the range of $10^{14}$ to $10^{21}$ cm$^{-3}$ to enhance tuning sensitivity for said resonant frequency of said FBAR.

4. The tunable FBAR of claim 1, wherein material of said bottom substrate is selected from a group including: Si, GaAs, glass, sapphire, AlN, $Al_2O_3$.

5. The tunable FBAR of claim 1, wherein materials of said bottom support membrane are selected to effect a temperature compensation to reduce unwanted shift of said resonant frequency during operations.

6. The tunable FBAR of claim 1, wherein said first biasing resistor and second biasing resistor are thin film resistors, materials of said first biasing resistor and second biasing resistor are selected from a group comprising: metals, metal alloys, metal oxides, metal nitrides, metal oxynitrides and their combinations.

7. The tunable FBAR of claim 1, wherein said first biasing resistor resistance value and second biasing resistor resistance value are preferably larger than 200 ohms.

8. The tunable FBAR of claim 1, further comprises a first temperature compensation layer with a first temperature compensation layer thickness covering said second metal electrode and first intrinsic piezoelectric layer to improve thermal stability of said FBAR.

9. The tunable FBAR of claim 1, further comprising a first intrinsic piezoelectric layer with a first intrinsic piezoelectric layer thickness deposited between said first metal electrode and said first doped piezoelectric semiconductor layer to reduce DC biasing voltage value and increase tuning sensitivity of said resonant frequency, forming the tunable FBAR with a Metal-Intrinsic piezoelectric semiconductor-Doped piezoelectric semiconductor-Metal (MIDM) structure, wherein said first intrinsic piezoelectric layer is selected from a compound material group including: AlN, GaN, AlGaN, ZnO, GaAs, AlAs, AlGaAs, LiNbO$_3$, PZT, BaTiO$_3$, quartz and KNbO$_3$.

10. The tunable FBAR of claim 1, further comprising a first intrinsic piezoelectric layer with a first intrinsic piezoelectric layer thickness deposited between said second metal electrode and said first piezoelectric semiconductor layer to reduce DC biasing voltage value and increase tuning sensitivity of said resonant frequency, forming the tunable FBAR with a Metal-Doped piezoelectric semiconductor-Intrinsic piezoelectric semiconductor-Metal (MDIM) structure, wherein said first intrinsic piezoelectric layer is selected from a compound material group including: AlN, GaN, AlGaN, ZnO, GaAs, AlAs, AlGaAs, LiNbO$_3$, PZT, BaTiO$_3$, quartz and KNbO$_3$.

11. The tunable FBAR of claim 1, further comprising a second doped piezoelectric semiconductor layer adjacent to said first doped piezoelectric semiconductor layer, said second doped piezoelectric semiconductor layer having a second piezoelectric layer thickness, a second piezoelectric layer doping concentration and a second piezoelectric layer doping type opposite to said first piezoelectric layer doping type, forming the tunable FBAR with a Metal-Doped piezoelectric semiconductor-Doped piezoelectric semiconductor-Metal (MDDM) structure, wherein a material of said second doped piezoelectric semiconductor layer are selected from a group including: AlN, GaN, AlGaN, ZnO, GaAs, AlAs, and AlGaAs and said second piezoelectric layer doping concentration is controlled to be in the range of $10^{14}$ to $10^{21}$ cm$^{-3}$.

12. The tunable FBAR of claim 1, further comprising a first intrinsic piezoelectric layer and a second doped piezoelectric semiconductor layer, said first intrinsic piezoelectric layer having a first intrinsic piezoelectric layer thickness, whereas said second doped piezoelectric semiconductor layer having a second piezoelectric layer thickness, a second piezoelectric layer doping concentration and a second piezoelectric layer doping type opposite to said first piezoelectric layer doping type, forming the frequency tunable FBAR with a Metal-Doped piezoelectric semiconductor-Intrinsic piezoelectric semiconductor-Doped piezoelectric semiconductor-Metal (MDIDM) structure, wherein said first intrinsic piezoelectric layer is selected from a compound material group including: AlN, GaN, AlGaN, ZnO, GaAs, AlAs, AlGaAs, LiNbO$_3$, PZT, BaTiO$_3$, quartz and KNbO$_3$ and material of said second doped piezoelectric semiconductor layer are selected from a group including: AlN, GaN, AlGaN, ZnO, GaAs, AlAs, and AlGaAs and said second piezoelectric layer doping concentration is controlled to be in the range of $10^{14}$ to $10^{21}$ cm$^{-3}$.

13. A tunable microwave FBAR filter with central frequency tuned and controlled by digital to analog converters comprising:
 at least a first series tunable FBAR resonator with motive biasing resistors;
 at least a second parallel tunable FBAR resonator with respective biasing resistors, wherein each pair of said first series tunable FBAR resonator and said second parallel tunable FBAR resonator is connected at a first contact point;
 at least a first coupling capacitor connecting to a first RF input contact and at least a second coupling capacitor connecting to a second RF output contact to block DC voltages;
 at least a first isolation resistor with a first resistance value, each said first isolation resistor is connected to each said series tunable FBAR resonator for isolation of RF signals; and
 at least a first digital to analog converter connected between said first isolation resistor and a common ground point to convert a first input digital signal from a first digital signal source to an output DC voltage with a first polarity and a first value,
said output DC voltage provide a biasing voltage to each said first series tunable FBAR resonator and each said second parallel tunable FBAR resonator for tuning of said central frequency of resonance in said microwave FBAR filter, so that RF signals applied to said first RF input contact at and around said central frequency of resonance are allowed to propagate through said first series tunable FBAR resonators to reach said RF output contact, hence said central frequency in said microwave FBAR filter is selected and tuned to a desired value by said first input digital signal applied to said digital to analog converter.

14. A tunable microwave FBAR filter of claim 13, wherein said first digital signal source is a digital processor.

15. A tunable microwave FBAR filter of claim 13, wherein said first digital to analog converter comprises a plurality of digital to analog converters, each separately connected to one said first contact point through one said first isolation resistor to provide an output DC voltage for biasing individually each pair of said first series tunable FBAR resonator and said second parallel tunable FBAR resonator.

16. A tunable microwave FBAR filter with central frequency tuned and controlled by digital to analog converters comprising:
- at least a first series tunable FBAR resonator with respective biasing resistors;
- at least a second parallel tunable FBAR resonator with respective biasing resistors, wherein each pair of said first series tunable FBAR resonator and said second parallel tunable FBAR resonator is connected at a first contact point;
- at least a first coupling capacitor connecting to a first RF input contact and at least a second coupling capacitor connecting to a second RF output contact for blocking DC voltages;
- at least a first isolation resistor with a first resistor resistance value, each said first isolation resistor is connected to one said series tunable FBAR resonator for isolation of RF signals;
- at least a second isolation resistor with a second resistor resistance value, each said second isolation resistor is connected to one said parallel tunable FBAR resonator for isolation of RF signals;
- at least a first digital to analog converter connected between said first isolation resistor and a common ground point for converting a first input digital signal from a first digital signal source to a first output DC voltage with a first polarity and a first value; and
- at least a second digital to analog converter connected between said second isolation resistor and said common ground point for converting a second input digital signal from a second digital signal source to a second output DC voltage with a second polarity and a second value;

said first output DC voltage provides a biasing voltage to each pair of said first series tunable FBAR resonator and said second parallel tunable FBAR resonator, whereas said second output DC voltage provide a biasing voltage to each said second parallel tunable FBAR resonator, for tuning of said central frequency of resonance in said microwave FBAR filter, so that RF signals applied to said first RF input contact at and around said central frequency of resonance are allowed to propagate through all said first series tunable FBAR resonators to reach said RF output contact, hence said central frequency in said tunable microwave FABR filter is selected and tuned to a desired value by said first and second input digital signals applied to said first and second digital to analog converters.

17. A tunable microwave FBAR filter of claim 16, wherein said first digital signal source and said second digital signal source are the digital processors and said first input signal and said second input signal are from the same digital processor.

18. A tunable microwave FBAR filter of claim 16, wherein said first digital signal source and said second digital signal source are the digital processors and said first input signal and said second input signal are from different digital processors.

19. A tunable microwave FBAR filter of claim 16, wherein said first digital to analog converter constitutes a plurality of first digital to analog converters, each separately connected to one said first isolation resistor to provide an output DC voltage for biasing individually each pair of said first series tunable FBAR resonator and said second parallel tunable FBAR resonator.

20. A tunable microwave FBAR filter of claim 16, wherein said second digital to analog converter constitutes a plurality of second digital to analog converters, each separately connected to one said second isolation resistor to provide an output DC voltage for biasing individually each said second parallel tunable FBAR resonator.

* * * * *